United States Patent
Pöppe et al.

(10) Patent No.: US 10,990,513 B2
(45) Date of Patent: Apr. 27, 2021

(54) DETERMINISTIC CONCURRENT TEST PROGRAM EXECUTOR FOR AN AUTOMATED TEST EQUIPMENT

(71) Applicant: Advantest Corporation, Tokyo (JP)

(72) Inventors: Olaf Pöppe, Tübingen (DE); Jürgen Sang, Renningen (DE)

(73) Assignee: Advantest Corporation, Tokyo (JP)

( * ) Notice: Subject to any disclaimer, the term of this patent is extended or adjusted under 35 U.S.C. 154(b) by 169 days.

(21) Appl. No.: 16/045,283

(22) Filed: Jul. 25, 2018

(65) Prior Publication Data

US 2019/0012256 A1    Jan. 10, 2019

Related U.S. Application Data

(63) Continuation of application No. PCT/EP2016/051729, filed on Jan. 27, 2016.

(51) Int. Cl.
| | |
|---|---|
| G06F 11/36 | (2006.01) |
| G01R 31/319 | (2006.01) |
| G01R 31/28 | (2006.01) |
| G01R 31/3177 | (2006.01) |

(52) U.S. Cl.
CPC ...... G06F 11/3688 (2013.01); G01R 31/2834 (2013.01); G01R 31/3177 (2013.01); G01R 31/31903 (2013.01); G01R 31/31907 (2013.01); G01R 31/31912 (2013.01); G06F 11/3664 (2013.01)

(58) Field of Classification Search
CPC ............ G06F 11/3688; G06F 11/3672; G06F 11/3684; G06F 11/3664; G06F 11/3668; G06F 11/3476; G06F 11/3466; G06F 11/3692

See application file for complete search history.

(56) References Cited

U.S. PATENT DOCUMENTS

| | | | |
|---|---|---|---|
| 6,868,513 B1 | 3/2005 | Botala et al. | |
| 6,927,591 B2 | 8/2005 | McCord | |
| 7,035,755 B2* | 4/2006 | Jones | G01R 31/31907 702/117 |
| 7,673,197 B2* | 3/2010 | Luff | G01R 31/2834 702/121 |
| 9,164,876 B2* | 10/2015 | He | G06F 11/3664 |

(Continued)

*Primary Examiner* — Nadeem Iqbal

(57) ABSTRACT

The invention concerns a test program executor for an Automated Test Equipment, wherein the test program executor is configured to execute a test flow having a plurality of test suites, wherein the test program executor is configured to asynchronously execute the plurality of test suites, wherein a test suite contains a call of a function of a subsystem, wherein the function of the subsystem is related with a subsystem operation that is to be executed by the subsystem, and to signal a call of a function of a subsystem by transmitting an asynchronous request to the subsystem, the asynchronous request having a call-specific call tree hierarchy address and the call-specific operation to be executed by the subsystem, and wherein the test program executor is further configured to determine an execution order of the subsystem operations, such that the execution order of the subsystem operations depends on their call-specific call tree hierarchy addresses.

27 Claims, 22 Drawing Sheets

(56) References Cited

U.S. PATENT DOCUMENTS

| | | | |
|---|---|---|---|
| 2006/0195747 A1* | 8/2006 | Pramanick | G01R 31/31907 714/742 |
| 2010/0229042 A1* | 9/2010 | Goyal | G01R 31/318558 714/31 |
| 2010/0318314 A1* | 12/2010 | Luff | G01R 31/2834 702/121 |
| 2012/0191400 A1* | 7/2012 | Sontakke | G01R 31/31724 702/119 |
| 2014/0266282 A1 | 9/2014 | Tamura et al. | |

* cited by examiner

| source code | | | subsystem „sub" | |
|---|---|---|---|---|
| line | | message | call tree | |
| 1 | def main() { | | / | |
| 2 | function1() | // { | /1 | |
| 3 | | // return sub.op1() | 1.1; op1() | op1() |
| 4 | | // } | 1.2; end() | end() |
| 5 | function2() | // { | /2 | |
| 6 | | // sub.op2() | 2.1; op2() | op2() |
| 7 | | // } | 2.2; end() | end() |
| 8 | if (function1.result > 0) | | /3 | |
| 9 | then { | | /3/1 | |
| 10 | function3() | // { | /3/1/1 | |
| 11 | | // sub.op3() | 3.1.1.1; op3() | op3() |
| 12 | | // } | 3.1.1.2; end() | end() |
| 13 | } | | 3.1.2; end() | end() |
| 14 | } | | 3.2; end() | end() |
| 15 | function4() | // { | /4 | |
| 16 | | // sub.op4() | 4.1; op4() | op4() |
| 15 | | // } | 4.2; end() | end() |
| 16 | } | | 5; end() | end() |

Figure 7

| source code | | | subsystem „sub" | |
|---|---|---|---|---|
| line | | message | | call tree |
| 1 | def main() { | | | / |
| 2 | function1() | // { | 113 | /1 |
| 3 | | // return sub.op1() | 1.1; op1() | op1() |
| 4 | | // } | 1.2; end() | end() |
| 5 | function2() | // { | | /2 |
| 6 | | // sub.op2() | 2.1; op2() | op2() |
| 7 | | // } | 2.2; end() | end() |
| 8 | if (function1.result > 0) | | | /3 — 130 |
| 9 | then { | | | /3/1 — 131 |
| 10 | function3() | // { | | /3/1/1 |
| 11 | | // sub.op3() | 3.1.1.1; op3() | op3() |
| 12 | | // } | 3.1.1.2; end() | end() |
| 13 | } | | 3.1.2; end() | end() |
| 14 | } | | 3.2; end() | end() |
| 15 | function4() | // { | | /4 — 132 |
| 16 | | // sub.op4() | 4.1; op4() | op4() |
| 15 | | // } | 4.2; end() | end() — 112f |
| 16 | } | | 5; end() | end() |

Figure 8

| source code | | | | subsystem „sub" 105 |
|---|---|---|---|---|
| line | | | message | call tree |
| 1 | def main() { | | | / |
| 2 | function1() | // { | 113 | /1 |
| 3 | 103a | // return sub.op1() | 1.1; op1()<br>114 — 1.2; wait() | op1()<br>wait() — 124a |
| 4 | | // } | 109 1.3; end() 118 | end() |
| 5 | function2() | // { | | /2 |
| 6 | 103b | // sub.op2() | 2.1; op2() | op2() |
| 7 | | // } | 2.2; end() | end() |
| 8 | if (function1.result > 0) | | 3.1; wait() | /3<br>wait() |
| 9 | then { | | | /3/2 |
| 10 | function3() | // { | | /3/2/1 |
| 11 | 103c | // sub.op3() | 3.2.1.1; op3() | op3() |
| 12 | | // } | 3.2.1.2; end() | end() |
| 13 | } | | 3.2.2; end() | end() |
| 14 | } | | 3.3; end() | end() |
| 15 | function4() | // { | | /5 |
| 16 | 103d | // sub.op4() | 4.1; op4() | op4() |
| 15 | | // } | 4.2; end() | end() |
| 16 | } | | 5; end() | end() |

Figure 9

| source code | | | subsystem „sub" | |
|---|---|---|---|---|
| line | | message | | call tree |
| 1 def main() { | | | | / |
| 2    function1() | // { | | | /1 |
| 3 | // | future = sub.op1() | 1.1; op1() | op1() |
| 4 | // | sub.release() | 1.2; end() | end() |
| 5 | // | compute(future.get()) | 1.3; wait() | wait() |
| 6 | // | } | 1.4; end() | end() |
| 7    function2() | // { | | | /2 |
| 8 | // | sub.op2() | 2.1; op2() | op2() |
| 9 | // | } | 2.2; end() | end() |

Figure 11

| line | source code | | | subsystem „sub" message | call tree |
|---|---|---|---|---|---|
| | | | | | 105 / |
| 1 | def main() { | | | | |
| 2 | function1() | // | { | 113  1; | /1 |
| 3 | | // | return sub.op1() | 1.1; op1() | op1() |
| 4 | | // | } | 1.2; end() | end() |
| | | | | 2; wait(1) | wait(1) |
| 5 | if (function1.result() > 0) { | | | | /3 |
| | | | | 3.1; parallel() | parallel() |
| 6 | then { | | | | /3/2 |
| 7 | function2() | // | { | | /3/2/1 |
| 8 | | // | sub.op2() | 3.2.1.1; op2() | op2() |
| 9 | | // | } | 3.2.1.2; end() | end() |
| 10 | } | // | { | 3.2.2; end() | end() |
| 11 | else { | | | | /3/3 |
| 12 | function3() | // | { | | /3/3/1 |
| 13 | | // | sub.op3() | 3.3.1.1; op3() | op2() |
| 14 | | // | } | 3.3.1.2. end() | end() |
| 15 | } | | | 3.3.2; end() | end() |
| 17 | } | | | 3.4; end() | end() |
| 18 | function4() | // | { | | /4 |
| 19 | | // | sub.op4() | 4.1; op4() | op4() |
| 20 | } | // | } | 4.2; end() | end() |
| 21 | | | | 5; end() | end() |

Figure 13

DETERMINISTIC CONCURRENT TEST PROGRAM EXECUTOR FOR AN AUTOMATED TEST EQUIPMENT

CROSS-REFERENCE TO RELATED APPLICATION

This application is a continuation of copending International Application No. PCT/EP2016/051729, filed Jan. 27, 2016, which is incorporated herein by reference in its entirety.

BACKGROUND OF THE INVENTION

Embodiments of the present invention relate to a test program executor for an Automated Test Equipment, to a computer program for implementing said test program executor, and to a test apparatus for testing a Device Under Test.

Due to cost pressure in the ATE (Automated Test Equipment) industry, there is a constant drive to increase the utilization of ATE systems. Most modern test systems, especially per-pin architectures, allow controlling tester instruments from independent threads running on a workstation. This can be used to run multiple independent tests in parallel and therefore increase the ATE resource utilization.

Unfortunately, device blocks are usually not completely independent. For example, a scan test can cause ground bounce, which in turn affects a concurrently running analog test. Often, the severity of such interference depends on the exact execution timing. From an application perspective therefore is a strong desire for fully deterministic execution timing.

Deterministic timing simplifies another problem related to concurrent test. Often, tester instruments and device interfaces are shared in between otherwise independent tests. For example, expensive tester instruments are multiplexed to multiple DUT (Device Under Test) pins or tester sites. Multiple functional blocks of a device share the same JTAG (Joint Test Action Group) interface for configuration. In case of concurrent test, access to these resources must be arbitrated. With a known timing, this arbitration can be computed upfront avoiding slow on-the-fly synchronization and locking.

Known workstations provided with test systems, for example the 93000® test system of Advantest Corp., are equipped with a four-core CPU capable of running eight hardware threads in parallel. Future systems can be expected with even significantly higher core counts. On the other hand, the test flow controlling the test execution is still single threaded like on all other ATE systems. This leads to the situation that the available CPU capacity is rarely used on known ATE systems.

Analysis of today's test flows show limited data flow dependencies, which allows the construction of a flow execution engine running many test suites in parallel. Without any further steps this would lead to an unordered non-deterministic test execution on the DUT as well as an unordered datalog.

Thus, there is a desire to improve existing test program executors such that they provide for a low latency fully deterministic concurrent execution for an ATE system.

SUMMARY

According to an embodiment, a test program executor for an Automated Test Equipment, wherein the test program executor is configured to execute a test flow having a plurality of test suites, wherein the test program executor is configured to asynchronously execute the plurality of test suites, wherein a test suite contains a call of a function of a subsystem, wherein the function of the subsystem is related with a subsystem operation that is to be executed by the subsystem, and to signal a call of a function of a subsystem by transmitting an asynchronous request to the subsystem, the asynchronous request having a call-specific call tree hierarchy address and the call-specific operation to be executed by the subsystem, and wherein the test program executor is further configured to determine an execution order of the subsystem operations, such that the execution order of the subsystem operations depends on their call-specific call tree hierarchy addresses.

Another embodiment may have a non-transitory digital storage medium having stored thereon a computer program for implementing the above inventive test program executor when being executed on a computer or a signal processor.

Still another embodiment may have a test apparatus for testing a Device Under Test, the test apparatus having the above inventive test program executor.

According to a first aspect of the invention, there is provided a test program executor for an Automated Test Equipment, wherein the test program executor is configured to execute a test flow comprising a plurality of test suites, wherein the test program executor is configured to asynchronously execute the plurality of test suites, wherein a test suite contains a call of a function of a subsystem, wherein the function of the subsystem is related with a subsystem operation that is to be executed by the subsystem, and to signal a call of a function of a subsystem by transmitting an asynchronous request to the subsystem, the asynchronous request comprising a call-specific call tree hierarchy address and the call-specific operation to be executed by the subsystem, and wherein the test program executor is further configured to determine an execution order of the subsystem operations, such that the execution order of the subsystem operations depends on their call-specific call tree hierarchy addresses.

The test program executor may be implemented and/or executed on a workstation which communicates with the actual tester hardware. According to the present invention, a subsystem may be arranged somewhere between the test program executor and the tester hardware. The subsystem may manage the communication between the workstation and the tester hardware, i.e. all interaction with tester instruments is handled via the subsystem. The subsystem translates, so to say, test program functions (also referred to as subsystem functions) into executable operations (also referred to as subsystem operations) that are to be executed, e.g. as hardware functions, on the tester equipment.

For this purpose, the inventive test program executor is configured to execute a so called test flow. A test flow controls the top level of a test program. A test flow comprises a plurality of test suites. A test suite, in turn, may comprise one or more test program functions. The test flow calls the test suites, and the test suites call the test program functions. All interaction with the test system is done within the test suites (e.g. by calling test program functions) called by the test flow. According to the inventive concept, the test flow to test suite communication is fully asynchronous, i.e. the flow does not wait for test suites to finish and test suites compute their results without an explicit request from the test flow. When the test flow reads a result from a test suite, it will wait until the test suite automatically returns it.

The test suites handle the actual testing including all interaction entailed with the test system and computation algorithms. All interaction with tester instruments (i.e. with the actual tester hardware) is handled via the inventive tester subsystem. The subsystem may deploy one or more, or even all of the features described in the following sections and may use the same to combine the commands issued by the test suites to deterministic real time sequences. In other words, the inventive subsystem is configured to arrange asynchronously called test program functions (within a plurality of test suites) into a proper order, namely into a deterministic real time hardware program sequence running on the tester hardware.

In other words, the test program executor is configured to deterministically execute a hardware test program for testing a Device Under Test (DUT) in an Automated Test Equipment (ATE) even though the test program functions itself may have been called asynchronously, i.e. in a non-deterministic order.

Stated in terms of the appended claims, the inventive test program executor is configured to asynchronously execute the plurality of test suites, wherein a test suite contains at least one call of a function of a subsystem, and wherein the function of the subsystem is related with a subsystem operation that is to be executed by the subsystem.

Furthermore, the inventive test program executor is configured to signal to the subsystem a call of a subsystem function by transmitting an asynchronous request (e.g. a message) to the subsystem. This asynchronous request (e.g. message) contains a call-specific, or individual, call tree hierarchy address. The asynchronous request further contains the call-specific subsystem operation (i.e. the subsystem operation that is related with the called subsystem function) that is to be executed by the subsystem. Accordingly, the inventive test program executor creates and collects, for each subsystem function call, a corresponding set of information containing the respective subsystem operation related with said subsystem function call and an individual call tree hierarchy address related with said subsystem function call. In other words, each subsystem function call triggers a subsystem operation and each subsystem operation has an individual call tree hierarchy address.

With the help of this set of information created for each one of the subsystem function calls, the inventive test program executor is configured to determine an execution order of the subsystem operations such that the execution order of the subsystem operations depends on their respective call-specific call tree hierarchy address.

This allows the inventive test program executor to combine single operations to a larger program. Given a modular subsystem with real time execution capabilities, this allows a fully deterministic and repeatable execution of sequences of commands scheduled with non-deterministic timing but deterministic order.

According to a second aspect, it is provided a computer program for implementing the inventive test program executor when being executed on a computer or signal processor.

According to a third aspect, it is provided a test apparatus for testing a Device Under Test, the test apparatus comprising the inventive test program executor.

BRIEF DESCRIPTION OF THE DRAWINGS

Embodiments of the present invention will be described below in more detail with reference to the figures, in which

FIG. 7 shows an implementation of an embodiment of an inventive test program executor;

FIG. 8 shows a further implementation of an embodiment of an inventive test program executor;

FIG. 9 shows a further implementation of an embodiment of an inventive test program executor;

FIG. 11 shows a further implementation of an embodiment of an inventive test program executor;

FIG. 13 shows a further implementation of an embodiment of an inventive test program executor;

DETAILED DESCRIPTION OF THE INVENTION

Figure 1:
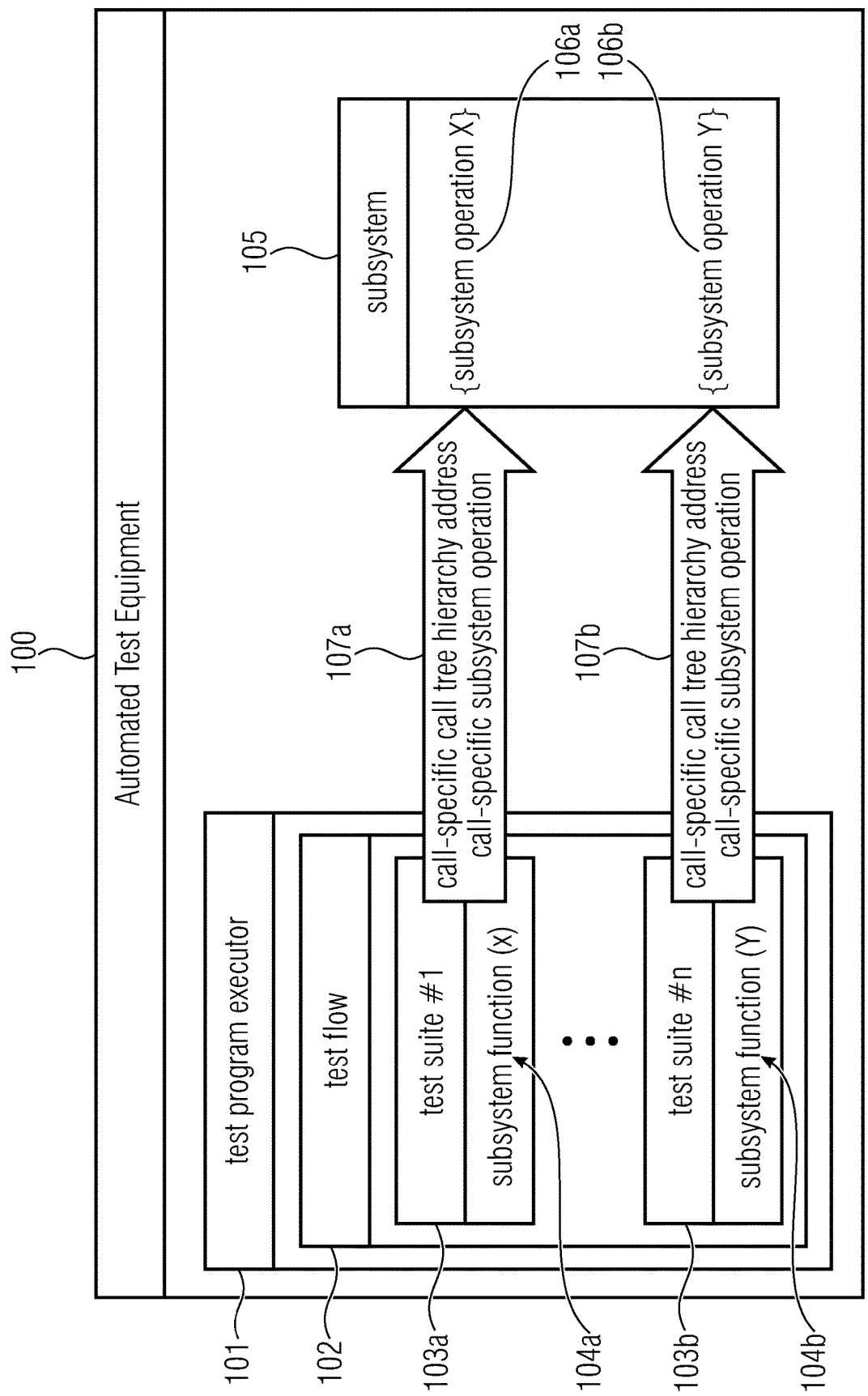
FIG. 1 shows a block diagram of an inventive test program executor.

Equal or equivalent elements or elements with equal or equivalent functionality are denoted in the following description and the corresponding Figures by equal or equivalent reference numerals.

Within the present disclosure, an asynchronous request may also be referred to as a message, for example an asynchronous end-request may also be referred to as an end-message, an asynchronous wait-request may also be referred to as a wait-message, an asynchronous parallel-execution-request may also be referred to as a parallel-execution-message, and an asynchronous unordered-execution-request may also be referred to as an unordered-execution-message.

Further within the present disclosure, a call tree may comprise one or more branches, wherein the beginning of a branch may be referred to as a node, and wherein a call in a branch of a call tree may be referred to as a child, and wherein a consecutive order of two or more calls in a branch of a call tree may be referred to as a child list.

Still further within the present disclosure, the term 'burst-execute' is used in the sense of collecting and/or assembling and/or arranging two or more single executable operations in such a way that they can be executed in one burst, i.e. at about the same time.

FIG. 1 shows an embodiment of an inventive test program executor 101 for an Automated Test Equipment 100. The test program executor 101 is configured to execute a test flow 102 comprising a plurality of test suites 103a, 103b.

The test program executor 101 is configured to asynchronously execute the plurality of test suites 103a, 103b, wherein a test suite 103a, 103b contains a call of a function 104a, 104b of a subsystem 105, wherein the function 104a, 104b of the subsystem 105 is related with a subsystem operation 106a, 106b that is to be executed by the subsystem 105.

The test program executor 101 is further configured to signal a call of a function 104a, 104b of a subsystem 105 by transmitting an asynchronous request 107a, 107b to the subsystem 105, the asynchronous request 107a, 107b comprising a call-specific call tree hierarchy address and the call-specific operation to be executed by the subsystem 105.

The test program executor 101 is further configured to determine an execution order of the subsystem operations 106a, 106b, such that the execution order of the subsystem operations 106a, 106b depends on their call-specific call tree hierarchy addresses.

The Automated Test Equipment 100 may comprise the test program executor 101, the subsystem 105 and further elements, such as one or more Devices Under Test, suitable communication interfaces, or the like.

As mentioned above, the test program executor 101 may execute a test flow 102. The test flow 102 may comprise a plurality of test suites 103a, 103b, which are indicated in FIG. 1 as test suite #1 to test suite #n.

The subsystem 105 may be an integral part of the test program executor 101. However, the subsystem 105 provides for a communication between the test flow 102 and the tester hardware.

When a subsystem function 104a, 104b is called within a test suite 103a, 103b, the subsystem 105 is notified about that call by means of a respective message 107a, 107b. In particular, when subsystem function (X) 104a is called within test suite #1 103a, message 107a will be sent to the subsystem 105 informing the subsystem 105 that said subsystem function (X) 104a has been called. Each call of a subsystem function 104a, 104b is related with a corresponding subsystem operation 106a, 106b. In other words, a call of a subsystem function 104a, 104b triggers a corresponding subsystem operation 106a, 106b, i.e. the operation that shall be executed by the subsystem 105 in response to said function call 104a, 104b.

Accordingly, the message 107a contains the corresponding subsystem operation 106a that is related with the call of subsystem function (X) 104a. The message 107a further contains a call-specific call tree hierarchy address, i.e. an individual address in a call tree that is allocated to each subsystem operation 106a, 106b. By means of said call-specific call tree hierarchy address, the subsystem 105 has an information about the call order of said function calls 104a, 104b, and about the execution order of said subsystem operations 106a, 106b, respectively.

The above described procedure may be applicable for each one of the plurality of test suites 103a, 103b. Still with reference to FIG. 1, when subsystem function (Y) 104b is called within test suite #n 103b, a message 107b is sent to the subsystem 105, the message 107b containing a call-specific call tree hierarchy address and the call-specific subsystem operation 106b.

With the help of the individual call-specific call tree hierarchy addresses related with each of the call-specific subsystem operations 106a, 106b, the test program executor 101 may determine an execution order of these subsystem operations 106a, 106b such that the execution order of these subsystem operations 106a, 106b depends on their individual call-specific call tree hierarchy address.

The call tree hierarchy addresses are built up such that the test program executor 101 may determine a certain hierarchy, advantageously in an ascending or a descending order. For example, the call tree hierarchy addresses may be comparable to addresses of houses in streets which are usually arranged in an ascending order. In the present invention, the individual call-specific call tree hierarchy addresses determine the execution order of the related subsystem operations 106a, 106b. For example, upon the call of subsystem function (X) 104a the related subsystem operation 106a may have been allocated a call tree hierarchy address 1.1 and upon the call of subsystem function (Y) 104b the related subsystem operation 106b may have been allocated a call tree hierarchy address 2.1. Due to these hierarchical addresses, the test program executor may now determine that subsystem operation 106a may be executed prior to subsystem operation 106b.

In the field of automated testing, concurrent testing is desired in some situations. Concurrent testing describes the parallel testing of several functions of a Device Under Test or even of two or more Devices Under Test at the same time.

Transferred to the constellation as depicted in FIG. 1, this means that it may be possible that a certain time is needed for the calculation of subsystem function (X) 103a. However, during that time, the test flow 102 may be blocked, i.e. the test flow 102 has to wait for the result of the calculation of subsystem function (X) 103a before it can proceed to the subsequent subsystem function (Y) 104b. A so called deadlock has been created.

According to the inventive concept, however, this deadlock may be dissolved by asynchronously calling the subsystem functions 103a, 103b and reordering the related subsystem operations 106a, 106b. That is, the test flow 102 does not wait with its execution for the retrieval of the result of the calculation of subsystem function (X) 103a but it continues directly with calling one of the subsequent subsystem functions, in this example the subsystem function (Y) 104b. Accordingly, the subsystem functions 104a, 104b are called asynchronously.

This asynchronous calling of subsystem functions 104a, 104b may, however, lead to a situation in which the chronological order of the execution of the hardware operations may be mismatched. In other words, asynchronous function calls may lead to a chaotic and non-deterministic behavior at the tester hardware side. To solve this problem regarding the mismatched chronological execution of hardware operations, the subsystem 105 brings the subsystem operations 106a 106b into their correct chronological order. Due to the content of the messages 107a, 107b, the subsystem 105 knows which subsystem function 104a, 104b has been called. Due to each individual call-specific call tree hierarchy address of each function call, the subsystem 105 additionally knows in which hierarchical or chronological order the respective subsystem function 104a, 104b had been called. Accordingly, even though the subsystem functions 104a, 104b may have been called asynchronously, i.e. in a non-deterministic order, the subsystem 105 re-establishes the correct chronological order of the related subsystem operations 106a, 106b such that the execution of the hardware operations may happen deterministically.

The above described problem related with asynchronous function calls shall be briefly described in more detail in the following.

Data Flow Driven Asynchronous Execution

For example, in traditional programming languages, functions are synchronously executed in the order they appear in the program code. At any point of time there is only a single thread of execution. Even on a multi-core workstation, only a single CPU can be utilized.

Analyzing the data flow dependencies, it becomes obvious, that many functions do not depend on the result of other functions. Therefore they can be executed in parallel. The utilization of a multi-core workstation increases.

In a typical programming language, there is one obstacle to this approach though: Function results are directly retrieved at the location of the call. The caller therefore is blocked until the function is finished and cannot schedule any further functions.

Reduce Data Flow Dependencies with Function Objects

One approach to this is to turn the functions into function objects providing asynchronous execution, and separate the result retrieval from the function execution. Now multiple functions can be started before their respective results are processed.

In the examples and embodiments which will be described in the following, the program 'main' is an example for a test flow 102, the source code-functions function1, function2, . . . , functionX are examples for test suites 103, the object sub is an example for a subsystem 105, its member functions such as sub.op1, sub.op2, . . . , sub.opX are examples for subsystem functions 104, and operations such as op1( ), op2( ), . . . , opX( ), wait( ), end( ), parallel( ) and unordered( ) are examples for subsystem operations 106.

Figure 2:
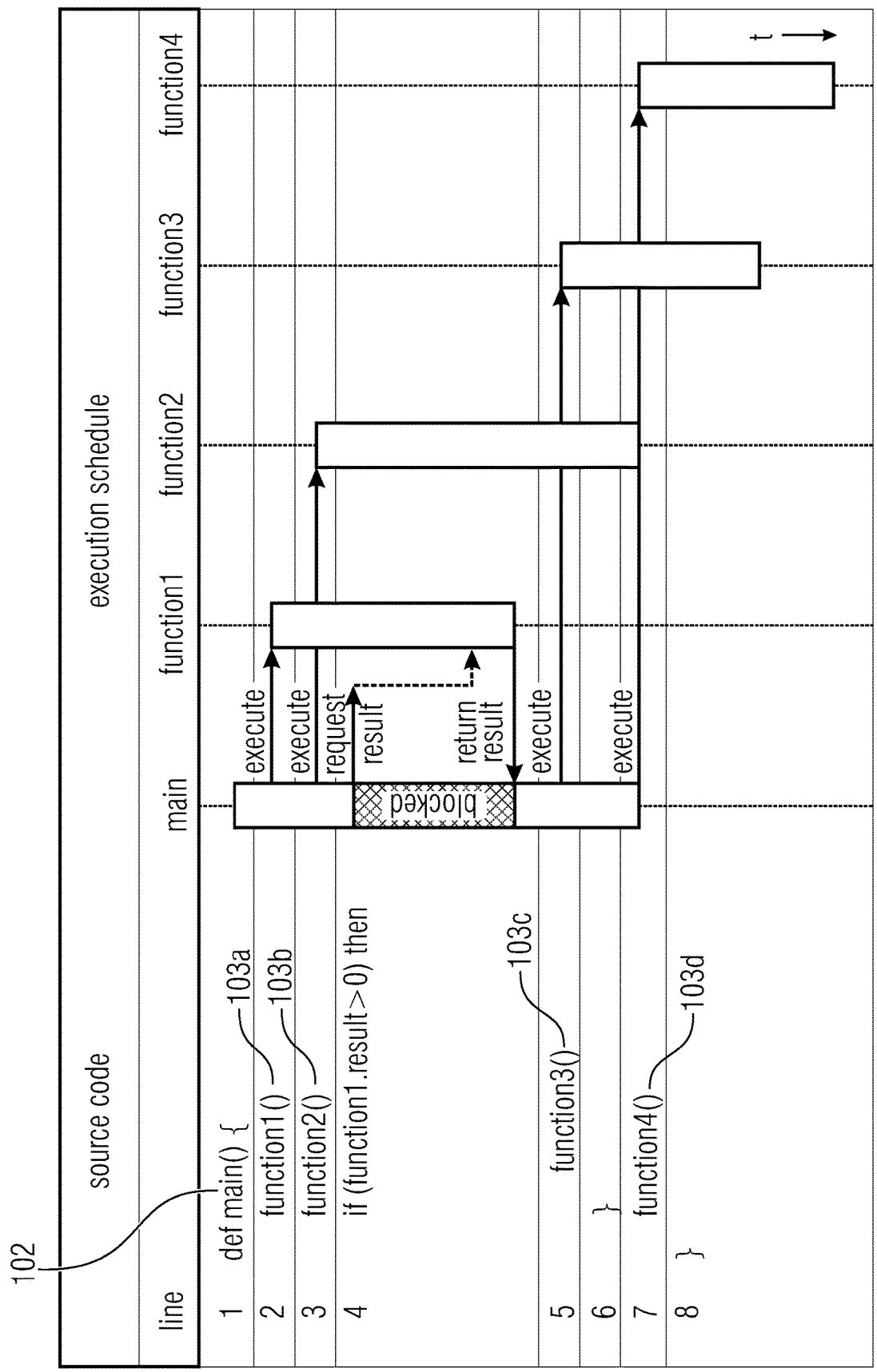
FIG. 2 shows a part of a source code and a corresponding execution schedule.

FIG. 2 shows an example for this type of execution in which functions are turned into function objects providing asynchronous execution, and in which the result retrieval is separated from the function execution. In function main 102, functions function1 103a and function2 103b are started without blocking. Then, the result of function1 103a is retrieved to make a control flow decision. At this point of time, the main function 102 is blocked. Once it retrieves the result it continues and schedules function function3 103c and function4 103d.

In this example, the result request is also sent asynchronously without waiting for the function1 103a to finish the execution. To achieve this, a command queue is associated with every function object. The object processes all commands in the queue in the order they appear.

Figure 3:
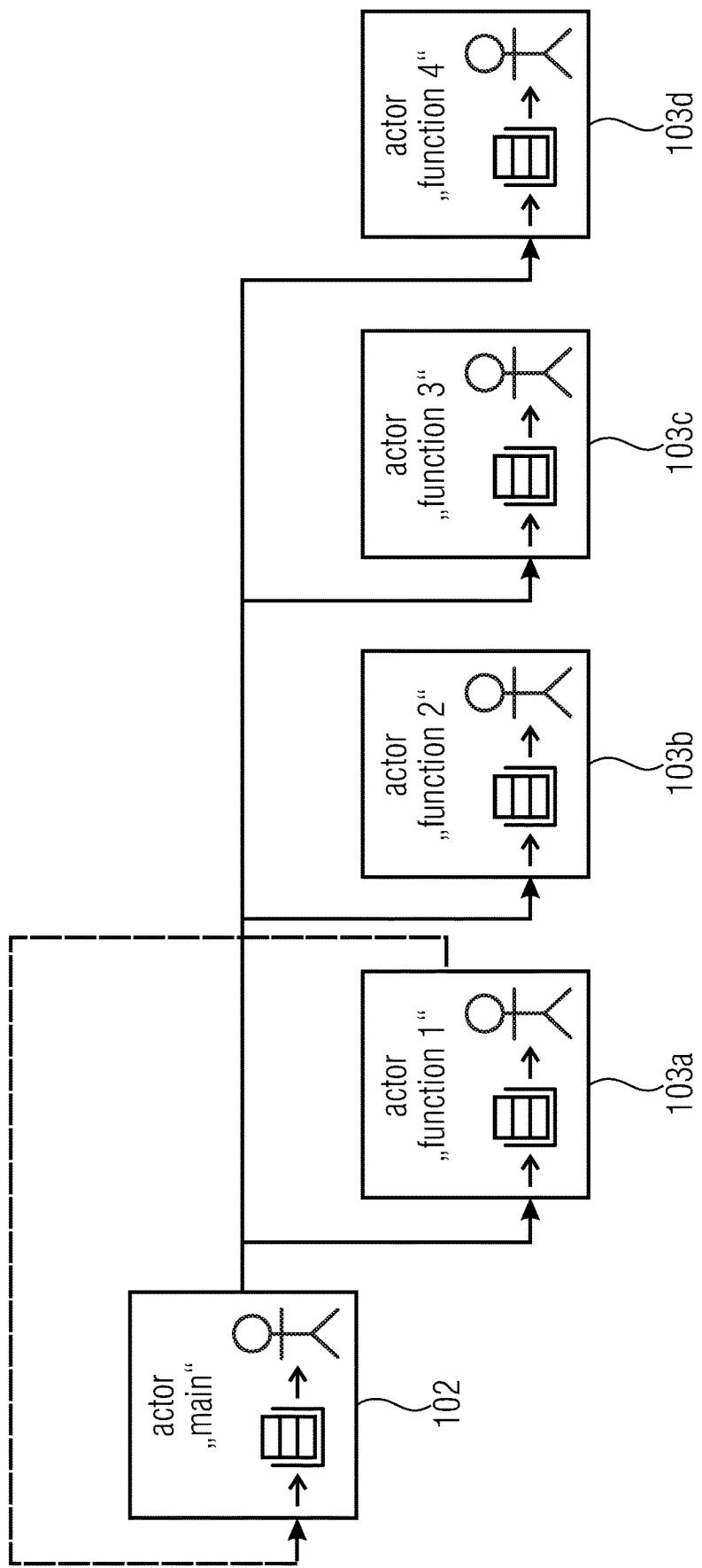
FIG. 3 shows a block diagram of an actor model belonging to the diagram of FIG. 2.

This design follows the actor model, as shown in FIG. 3. Each function 103a, 103b, 103c, 103d is an actor with an inbox for requests. It processes the requests in the order they appear. When it needs to communicate with other actors in the system, it sends requests to their respective inboxes.

Modeling Control Flow Decisions as Actors

The execution in the previous example shown in FIGS. 2 and 3 may not be ideal. Function function4 103d does not depend on function1 103a. Nevertheless, it is not scheduled by function main 102 until function1 103a returns its result.

Figure 4:
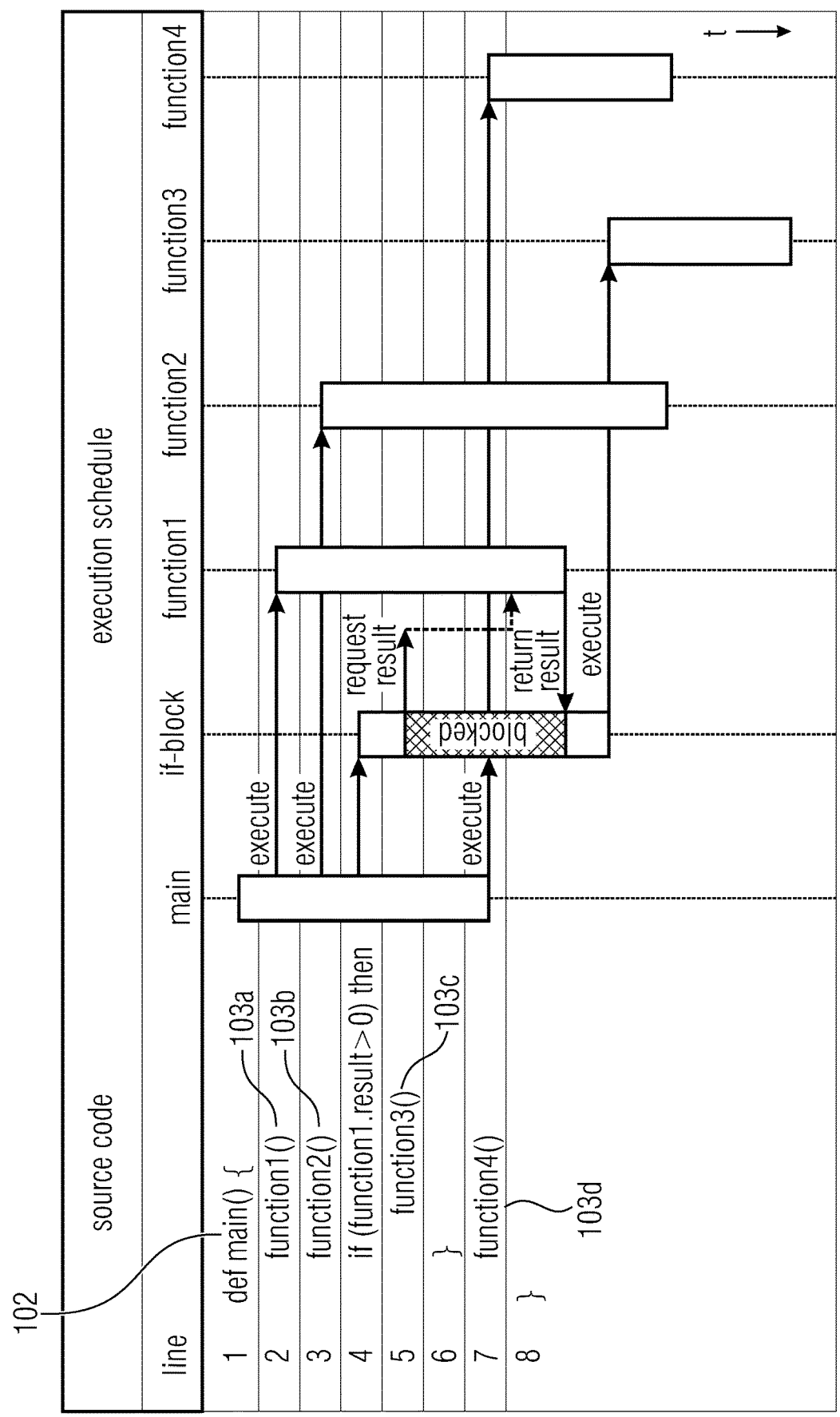
FIG. 4 shows a part of a source code and a corresponding execution schedule.
Figure 5:
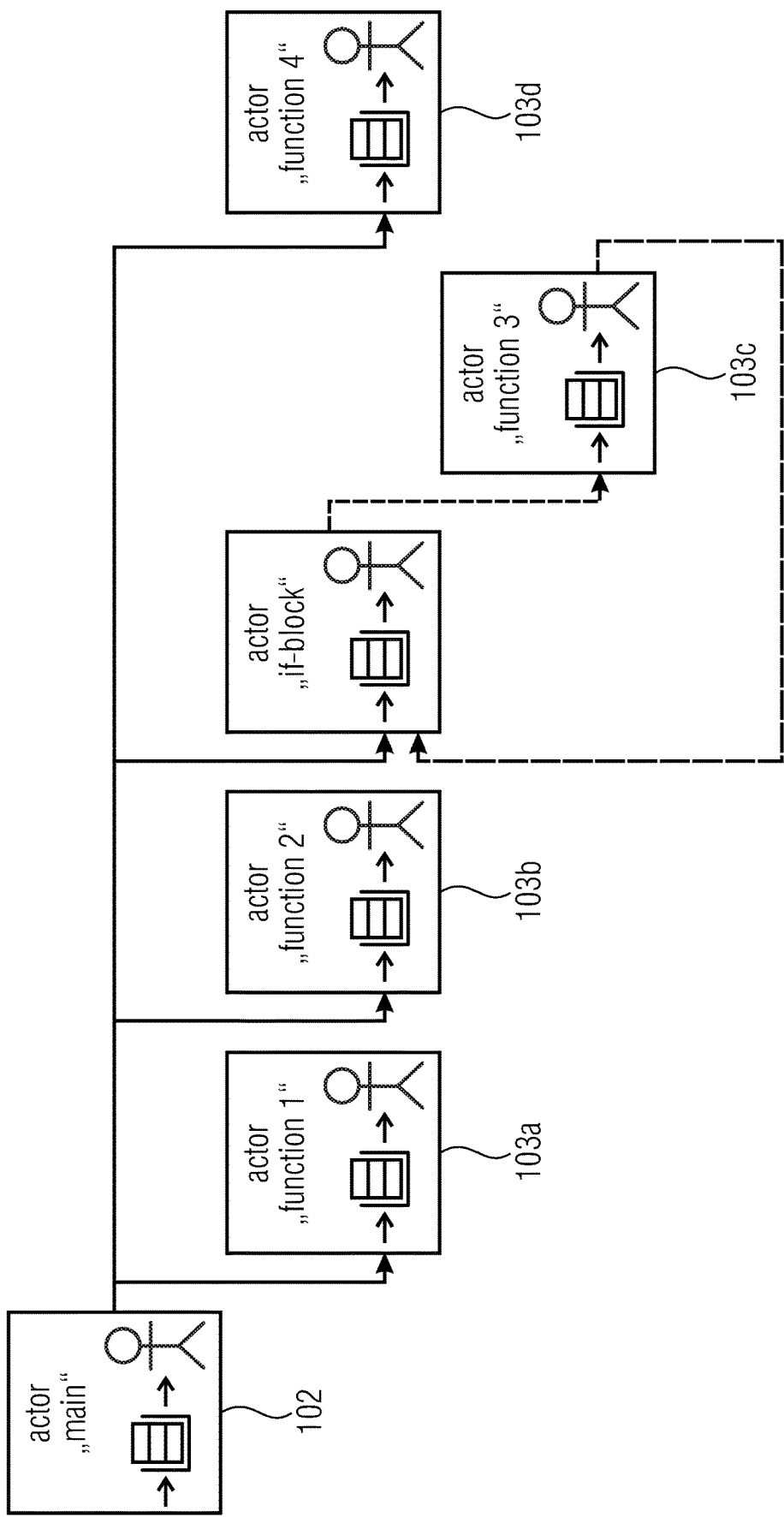
FIG. 5 shows a block diagram of an actor model belonging to the diagram of FIG. 4.

Having a closer look at the situation depicted in FIG. 2, only the conditional block depends on the results of function1 103a. Therefore the execution can be improved by handling the condition in a separate actor, which is asynchronously started by function main 102. FIG. 4 shows the modified execution schedule. FIG. 5 shows the actor system behind it.

Complex Objects and Futures

So far we have worked with simple functions returning a result. In object oriented languages, complex subsystems are modeled as objects maintaining the subsystem state and member functions to modify and query the state.

To allow for non-blocking execution of query functions, so-called futures can be used. The query function immediately returns a so-called promise, which the caller stores in a future. The actual access is performed asynchronously at a later point of time. The result is eventually returned asynchronously. The caller now can schedule additional calls and check the future later. At this point of time, the caller will be blocked until the result of the original query arrives.

Figure 6:
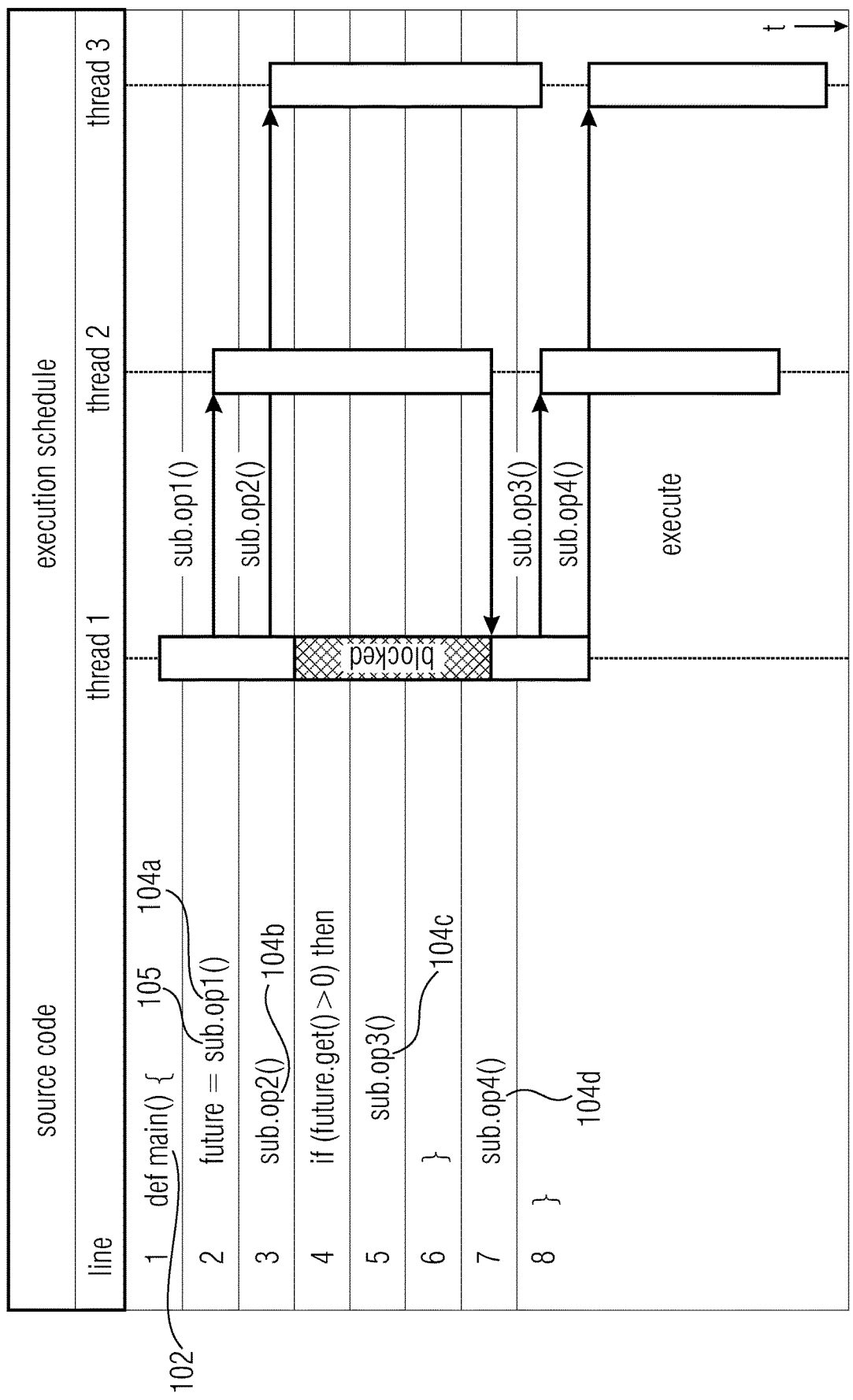
FIG. 6 shows a part of a source code and a corresponding execution schedule.

FIG. 6 shows an example application using futures. There is a subsystem represented by the object sub 105, which offers four member functions op1, op2, op3, op4 104a, 104b, 104c, 104d. Call sub.op1 returns a promise without blocking. Function main 102 continues without waiting for this operation and schedules sub.op2. Then it reads the value from the future, which blocks the execution until it receives the result from sub.op1.

Looking at the execution schedule, it is almost identical to the asynchronous function call example from FIG. 2. However, other than in the previous example, in this example idle execution threads are reused. This is a common practice to minimize thread generations, which is usually expensive.

Deterministic Ordering of Asynchronous Requests to a Subsystem

The approach described in the previous chapter so far ignores side effects of function and method calls. Functions and methods might interact with a subsystem 105, which is at least in parts sensitive to ordering. This ordering is provided by the original program. However, it gets lost when functions are called asynchronously.

The following chapter describes how to provide subsystems 105 with sufficient information so they can organize operations in the correct order.

Transmitting Call Tree Information to Subsystems

One important information a subsystem 105 uses for ordering operations 106a, 106b is, from which position of the original call tree the functions 104a, 104b were issued. For this, the calling code manages a hierarchical address to each block in the code on a per subsystem level.

With reference to FIG. 7 it can be seen that, when a subsystem function 104a is called within a test suite 103a, a message 107 is sent to the subsystem 105 which builds a call tree 113 with the help of the information contained in said message 107. The information contained in the message 107 may be an information about a call-specific call tree hierarchy address 109 and about the call-specific operation 118 that is to be executed by the subsystem 105, wherein the subsystem operation 106 itself is related with the subsystem function 104 that has been called.

As can be seen in the example of FIG. 7, the subsystem function sub.op1( ) 104a is called. Upon said call, a message 107 is sent to the subsystem 105. The message 107 contains information about the call-specific address 109 of said call and the operation 118 that is to be executed by the subsystem 105 in response to said call. As each subsystem function 104 is related with a corresponding subsystem operation 106, here the message 107 contains an information 118 that subsystem operation op1( ) is to be executed by the subsystem 105 in response to the related function call sub.op1( ).

Message 107 contains an information about a call tree hierarchy address 109. In the example shown in FIG. 7, message 107 contains an address information 109 which comprises a call tree hierarchy address with number 1.1, which represents the call tree hierarchy address within the call tree 113 that is built up by the subsystem 105. As can be seen, the call tree 113 has nodes 141, 142, 143, 144 which open up an own hierarchy level.

For example, when a function 102 calls another function 103a, 103b or a code block 110, 111, it extends the address by another level. When a function 103a, 103b calls an operation 104a, 104b on a subsystem 105, it adds the address 109 to the actual call. When a function 103a, 103b is finished, it notifies the subsystem 105, that it will issue no further calls, e.g. by means of an end operation 112a, 112b.

That is, a message 108 is sent to the subsystem 105 which message 108 contains information about its call-specific address 109 and about the call-specific operation 118 that is to be executed by the subsystem 105. In this example, the message 108 contains an address information 109 which comprises a call tree hierarchy address with number 1.2 and an operation information 118 saying that the operation to be executed by the subsystem 105 is an end-operation.

Stated differently, the test program executor 101 is configured to transmit to the subsystem 105 an end-message 108 at the end of a test suite 103a, 103b and/or at the end of a subsystem function 104a, 104b, wherein the end-message 108 comprises information about an individual call-specific call tree hierarchy address 109 and information about an end-operation 118 that signals the subsystem 105 that no further calls will be issued.

In other words, the subsystem 105 is configured to receive messages 107, 108 and to insert the transmitted subsystem operation (i.e. the subsystem operation which is coded by the operation information 118 in the message 107, 108) into the call tree 113 at a call tree position depending on its call tree hierarchy address 109.

Upon receipt of the messages 107, 108, the subsystem 105 organizes the incoming calls in a call tree 113 based on their transmitted respective individual hierarchical addresses 109. For each message, the call tree 113 comprises a respective notification. For example, upon receipt of message 107, the subsystem 105 includes a respective notification 112 containing subsystem operation op1( ) 106a at the place defined by its individual call tree hierarchy address 109. Each notification 112 in the call tree 113 tells the subsystem 105 which subsystem operation has to be executed in which order.

The subsystem 105 executes the subsystem operations in the order defined by the tree 113. When the subsystem 105 reaches the end of the child list of a node 141, 142, 143, 144 in the tree 113, it checks for an end notification 112a to 112f. If there is one, the execution continues at the parent level. Otherwise the subsystem 105 waits for more incoming calls on the current hierarchy level.

In the example shown in FIG. 7, the subsystem 105 receives the end-message 108 and inserts the transmitted end-operation 118 into the call tree 113 at a call tree position depending on its call tree hierarchy address 109, namely at a position following the preceding subsystem operation op1( ) 106a within the call tree hierarchy level that has been opened up by node /1 (141).

Stated in more general terms, upon a subsystem function call, a message 107, 108 is sent to the subsystem 105. Said message 107, 108 contains information about an individual call-specific call tree hierarchy address 109 and about the call-specific, or function-call-related, subsystem operation 118 that is to be executed by the subsystem 105. Based on the information contained in said message 107, the subsystem 105 builds up a call tree 113, wherein each subsystem operation 106 is ordered within said call tree 113 according to its individual call tree hierarchy address 109. In other words, a message 107 contains information 118 about the subsystem operation 106 that is to be executed, and an address information 109 telling the subsystem 105 in which order the subsystem operations 106 are to be executed. This is done by a call tree reconstruction.

FIG. 7 shows an example of the call tree reconstruction. The functions function1, function2, function3 and function4 103a to 103d all interact with subsystem sub 105. When a member function 104a to 104d of the subsystem 105 is called, a message 107 is transmitted to it containing operation information 118 about the subsystem operations 106a to 106d as well as address information 109 about the address in the call tree 113.

An additional end message 108 is also sent at the end of each function call. The subsystem 105 organizes the calls and end messages in a tree 113 based on the address information 109. It may organize the calls and end messages according to their addresses in an ascending order, i.e. starting from address number 1.1 to number 1.2 and so forth until arriving at the last address number 5. The tree 113 eventually reflects the structure of the source code on the left hand side of FIG. 7.

Generally, the call tree hierarchy addresses 109 contain information as to the call tree hierarchy level and the order of execution of the operation within said call tree hierarchy level. Still with reference to FIG. 7, it can be seen that function3 may comprise four messages, wherein a first message 138 has the address 3.1.1.1 and a second message 139 has the address 3.1.1.2. In this example, the first three digits of the address indicate the call tree hierarchy level. The last digit of the address indicate the execution order, i.e. operation op3( ) having address 3.1.1.1 is to be executed before the end-operation end( ) having address 3.1.1.2, wherein both operations are to be executed on the same hierarchy level 3.1.1.

Stated in more general terms, the test program executor 101 is configured to associate, at each call tree hierarchy level, each subsystem operation 106a, 106b with an individual call tree hierarchy address 109, wherein each of the individual call tree hierarchy addresses 109 contains an information as to the call tree hierarchy level and the order of execution of the operation 106a, 106b within said call tree hierarchy level.

FIG. 8 shows a potential state (a transient call tree state) during call tree reconstruction in the previous example. Here, the messages from the "then" block have not been transmitted, while all other messages have already arrived at the subsystem 105. During the call tree traversal the subsystem 105 eventually hits node "/3" 130. At this point the subsystem 105 expects node "/3/1" 131 or an end message. As both are missing, the subsystem 105 will wait for further messages to appear rather than to continue at node "/4" 132.

So no matter what order messages 107, 108 appear from functions 103a, 103b or code blocks, calls are executed in the order defined by the original call tree.

Notifying Subsystems about Data Flow Dependencies

In many cases subsystems 105 can optimize the calls, e.g. by combining multiple calls into a single more efficient call or by reordering them. This deferred execution creates the risk of a dead lock: A subsystem 105 might wait for more calls from a caller. The caller might wait for a result from the subsystem 105.

To solve this problem, callers must inform the subsystem 105 about data flow dependencies before they wait on a subsystem result. This is handled by sending an additional wait message similar to the end message described in the previous section.

FIG. 9 shows an example for data flow dependency notifications. Function1 returns the result of sub.op1. As it blocks on the result access at this point, it sends a wait instruction 114 to subsystem sub 105. The conditional block in main depends on the result of function1. Here, a wait instruction 114 is sent to subsystem sub 105 before the then-block is executed.

As described with respect to FIG. 7, in the example of FIG. 9 a wait-message 114 is sent to the subsystem 105. The wait message 114 contains an operation information 118 about the operation to be executed by the subsystem 105, i.e. operation wait( ), and information 109 about its address in the call tree 113. Upon receipt of message 107, the subsystem 105 inserts the transmitted wait-operation 118 (i.e. a notification 124a containing an information that a wait-operation has to be executed) into the call tree 113.

Stated in more general terms, the subsystem 105 is configured to receive an asynchronous wait-request 114 and to insert the transmitted wait-operation 118 into the call tree 113 at a call tree position depending on its call tree hierarchy address 109.

Figure 10:
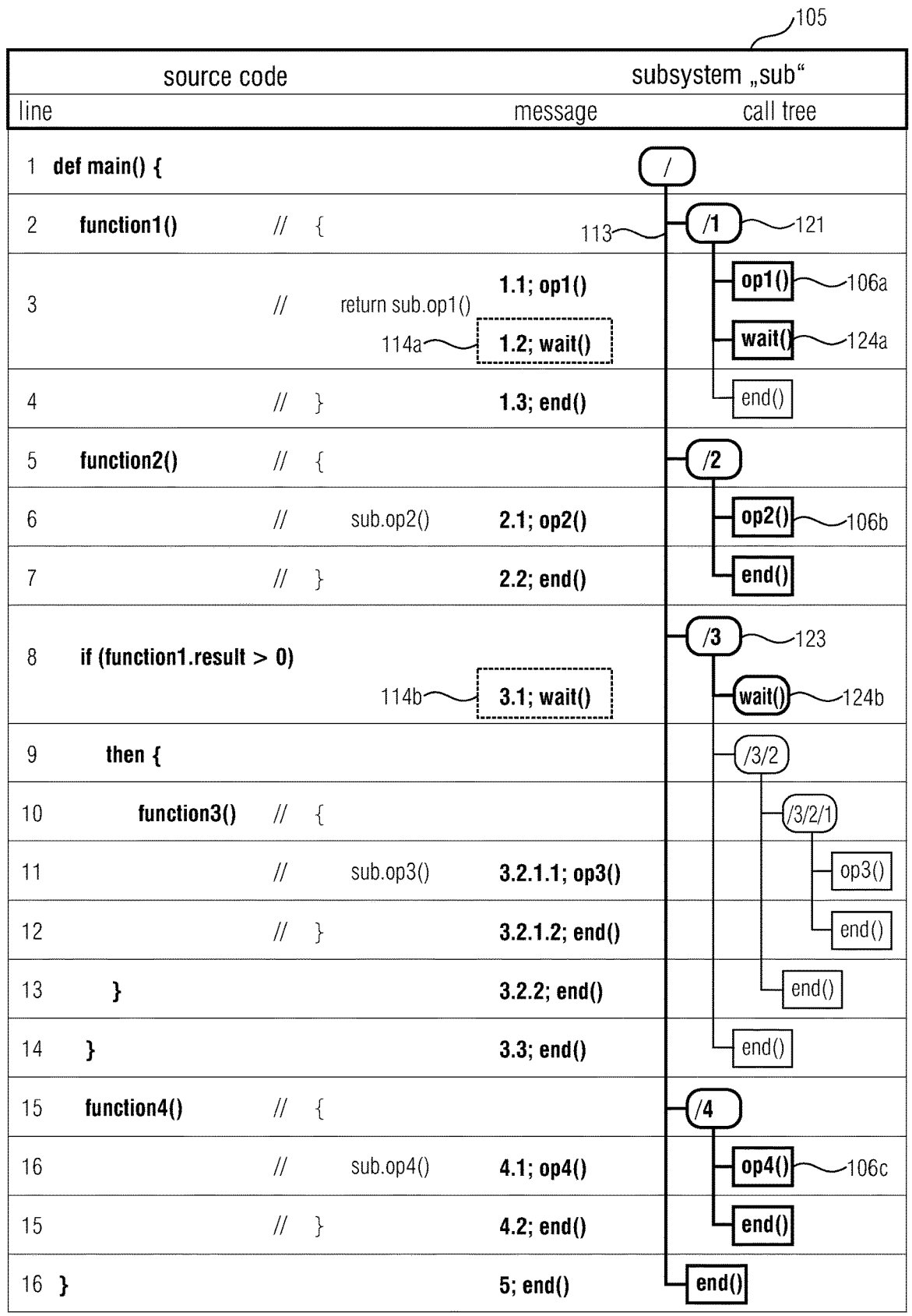
FIG. 10 shows a further implementation of an embodiment of an inventive test program executor.

FIG. 10 now shows the critical point during the execution. The subsystem 105 is collecting instructions, i.e. subsystem operations 106a to 106d, to be executed in a single burst. Function2 and function4 are finished issuing instructions to the subsystem 105. Function1 stopped when it accessed the result of sub.op1 and sent a wait instruction 114a. The if-block stopped when it accessed the result of function and also sent a wait instruction 114b.

Based on these two wait instructions 114a, 114b the subsystem 105 now detects, that its caller will not add any further instructions to subtrees /1 (121) and /3 (123) inside the call tree 113 until the subsystem 105 performs the operations it has received so far.

It therefore traverses the call tree 113 in depth first order and collects all operations 106a, 106b, 106c until it hits a wait instruction 124a, 124b or the end of the tree 113. In this case it only collects sub.op1 106a before it hits the wait statement 124a at position 1.2. At this point it executes the collected operation 106a, returns its result and resumes waiting for more instructions.

Function1 will eventually receive the result of sub.op1 106a, resume its operation and make its result available. The if-block now receives this result, resumes its operation as well, and issues further commands to the subsystem 105. The deadlock is successfully avoided.

Stated in more general terms, if the execution of a second test suite 103c depends on the result of the execution of a first test suite 103a the test program executor 101 is configured to transmit an asynchronous wait-request 114 to the subsystem 105, wherein the asynchronous wait-request 114 comprises an individual call tree hierarchy address 109 and a wait-operation 118 that signals the subsystem 105 to wait with the execution of the second test suite 103c until the execution of the first test suite 103a returns a result.

Early Release of Subsystems

The previous section described how to detect and handle data flow dependencies affecting a subsystem 105. To allow a subsystem 105 to efficiently burst together operations 106a to 106d in real world applications, this is not sufficient. Most operations yield a result its caller is depending on. These dependencies must be modified in a way, that they do not prevent the subsystem 105 from bursting operations 106a to 106d.

To achieve this, subsystem operations 106a to 106d are changed so they do not return the result itself but a promise which is stored by the caller in a future, such as shown in FIG. 11. Now when the function 104 has called all subsystem operations 106 entailed, it explicitly releases the subsystem 105, so that the subsystem 105 does not wait for any further calls issued by this function 104. This allows the subsystem 105 to process calls from later function calls and to combine all operations 106 into a single burst execution. After the execution, the subsystem 105 delivers all results, which the calling functions 104 then can access via the future variables.

The release operation on the subsystem 105 can be implemented by sending the previously introduced end message. This message already tells the subsystem 105, that the hierarchy level in the call tree 113 is complete, i.e. the calling function will not issue any further commands to the subsystem 105.

For simplicity every result access still sends wait messages even after the release. At the end of the function call an end message is still sent implicitly even though it is not needed. Because of the previously sent end message, the subsystem 105 ignores them. This approach frees the calling function from keeping track of the subsystem state.

FIG. 11 shows an example for this approach. Main calls function1 and function2 in a sequence without any data flow dependencies. Function1 performs subsystem operation sub.op1 and feeds its result into a computation. This subsystem call does not return the result directly but in form of a promise. Function1 stores this promise in variable future. Next, it releases the subsystem 105 and finally accesses the result to feed it into the call to compute. At this point function1 now blocks and waits for the subsystem 105 to return a result.

Looking at the resulting effective subsystem call tree 113, it does not contain any wait instructions relevant for the subsystem's scheduler. This allows bursting instructions sub.op1 and sub.op2 into a single operation. After this operation is executed, the subsystem 105 returns the result of sub.op1 to function1. This unblocks function1 and allows it to continue with the computation.

Parallel Execution

Sometimes it can be of advantage for the programmer to give a subsystem a hint, where operations can be executed in parallel rather than sequentially. For this, a parallel block is introduced. The block opens up a new level of hierarchy similar to a function call. Additionally, it sends a message to the subsystem 105 telling it, that functions and operations on this level can be executed in parallel.

Figure 12:
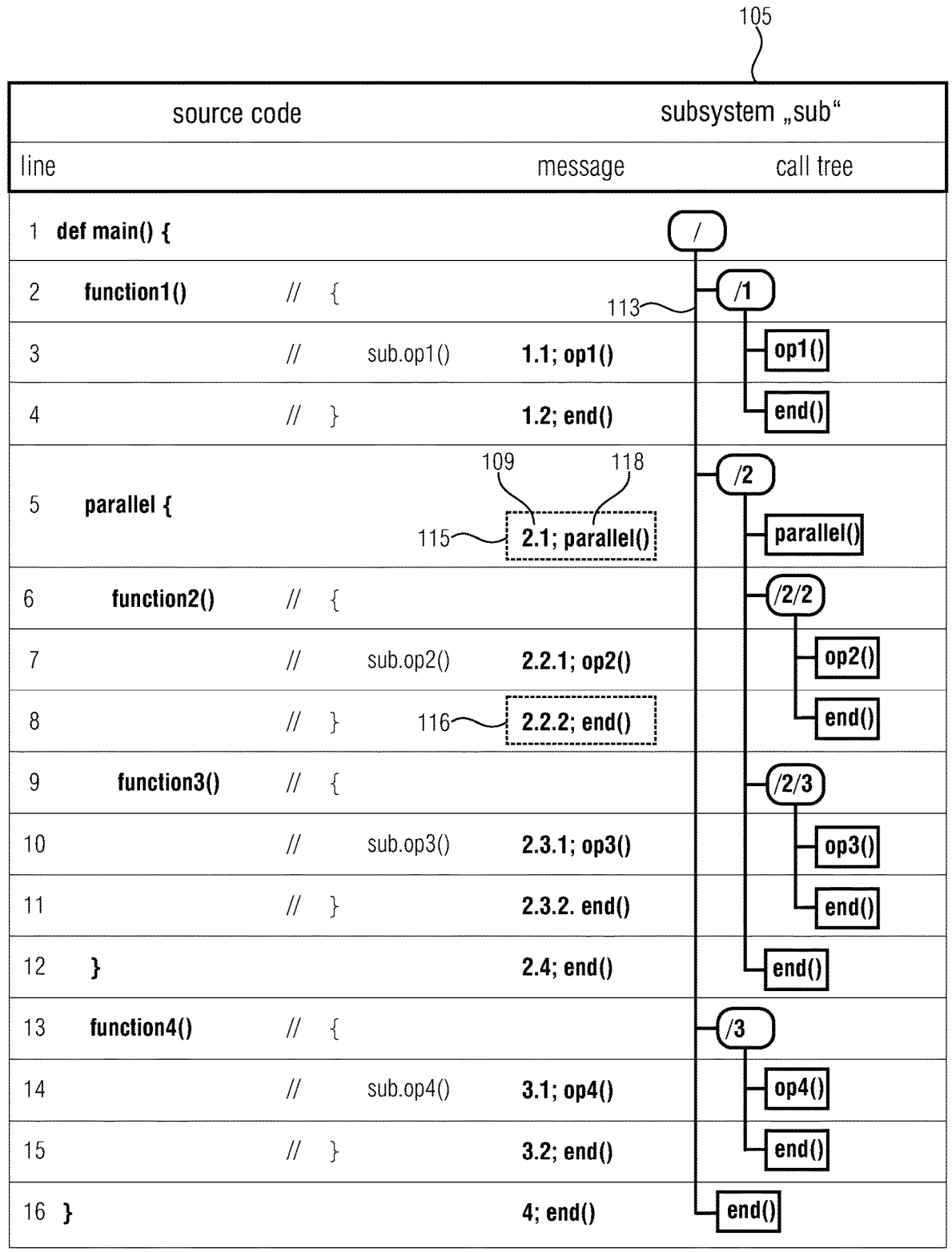
FIG. 12 shows a further implementation of an embodiment of an inventive test program executor.

FIG. 12 shows an example for parallel execution. The parallel statement on line 5 in function main opens up a new hierarchy level in the call tree 113. At the beginning of the parallel block a parallel message 115 is sent. At the end of the block an end message 116 is sent.

Parallel Execution of Conditional Blocks

ATE Systems need to run the same program on multiple DUTs in parallel. One way to achieve this is to run a single program on all DUTs in parallel and activate and deactivate DUT interaction based on control flow branches.

As shown in FIG. 13, applied to the system described so far, this turns a conditional if-then-else statement into a parallel statement, where, depending on the condition, different DUTs are activated and interacted with.

Unordered Execution

Figure 14:
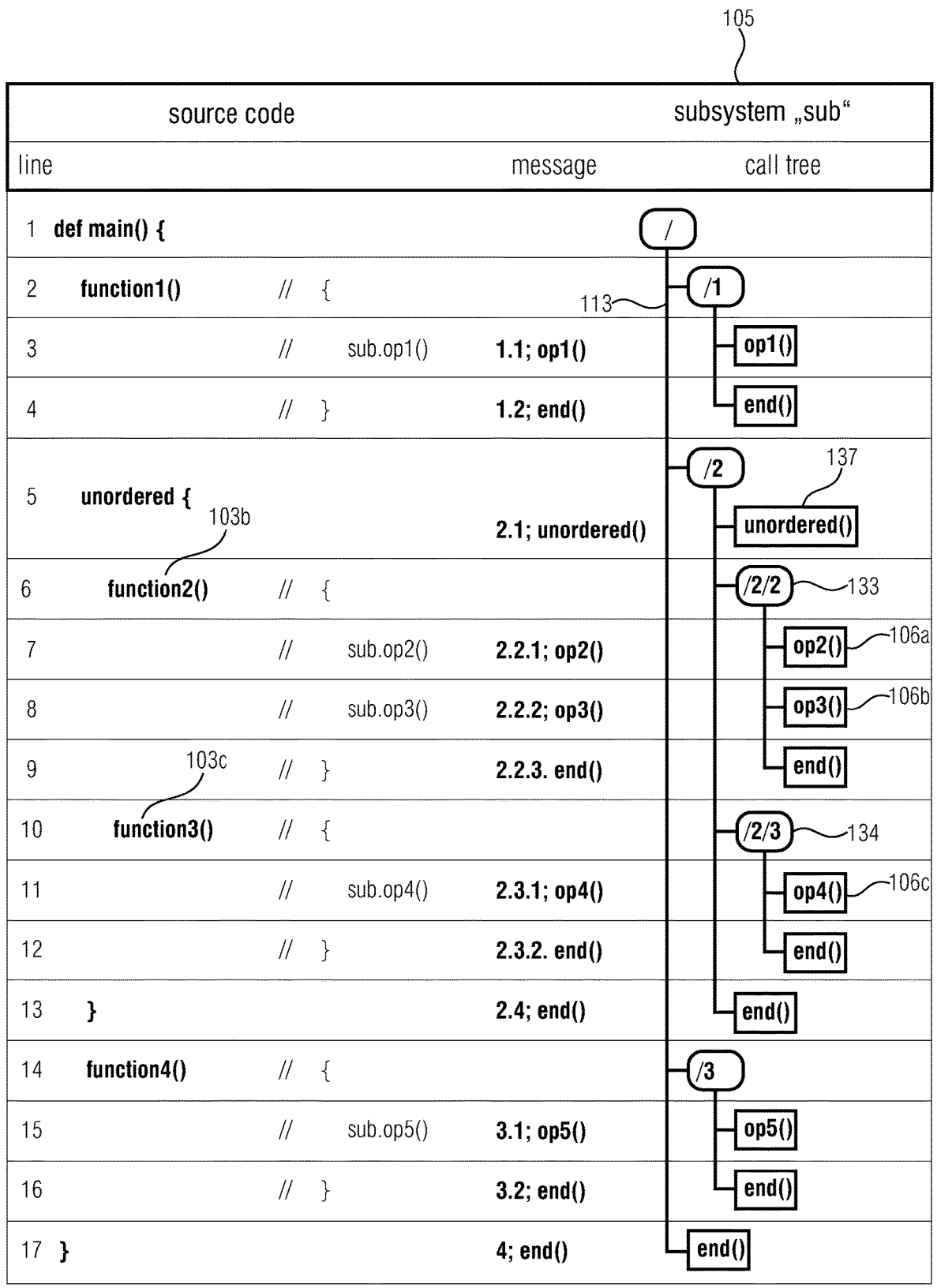
FIG. 14 shows a further implementation of an embodiment of an inventive test program executor.

As shown in FIG. 14, sometimes instructions to a subsystem 105 do not need to be ordered on some level of the call hierarchy. For example in an ATE test program some test suites 103b, 103c can be reordered without any impact on the test program result. On the other side, reordering might allow a subsystem 105 to optimize resource utilization or eliminate certain commands.

Therefore, an unordered block is introduced here. This unordered block is indicated to the subsystem 105 by an unordered message 117. When the subsystem 105 analyzes a call tree node 137 associated with such a block 117, it may change the order of sub trees 133, 134 and operations 106a, 106b, 106c attached to this node 133, 134.

FIG. 14 shows an example of an unordered block 117. In this case, the subsystem 105 is allowed to reorder the instructions sent from function2 103b and function3 103c. This can generate the sequences op2, op3, op4 as well as op4, op2, op3 depending on the order chosen by the subsystem 105.

Asynchronous Test Flow with Deterministic DUT Interaction and Datalog

With the features from the previous sections, an ATE test program executor 101 can now be realized, which works fully asynchronously on the workstation, while performing all operations 106 on the test system itself in a deterministic order controlled by the program code and creating a fully deterministic datalog. If there are data flow dependencies on the test flow or test suite level, there will be multiple deterministically executed test system instructions rather than one.

The top level of the test program is controlled by a test flow 102. This test flow 102 may use a block oriented programming language. All interaction with the test system is done within test suites 103a, 103b called by the test flow 102. The test flow to test suite communication is fully asynchronous, i.e. the test flow 102 does not wait for test suites 103a, 103b to finish, and test suites 103a, 103b compute their results without an explicit request from the flow 102. When the flow 102 reads a result from a test suite 103a, 103b, it will wait until the test suite 103a, 103b automatically returns it.

The test suites 103a, 103b handle the actual testing including all interaction entailed with the test system and computation algorithms. All interaction with tester instruments is handled via the tester subsystem 105. This subsystem 105 deploys all features described in the previous sections and uses this to combine commands issued by the test suites 103a, 103b to deterministic real time sequences.

The test evaluation is implemented in the test function 104. This function 104 reads the result from a future passed by the test suite 103a, 103b, compares it with expected values, logs the data via the datalog subsystem, and returns the test result to the test flow 102. Besides the test results, it writes the call hierarchy of test flows 102 and test suites 103 to the datalog, with a log entry at test flow or test suite start and another one at the end.

Figure 15:
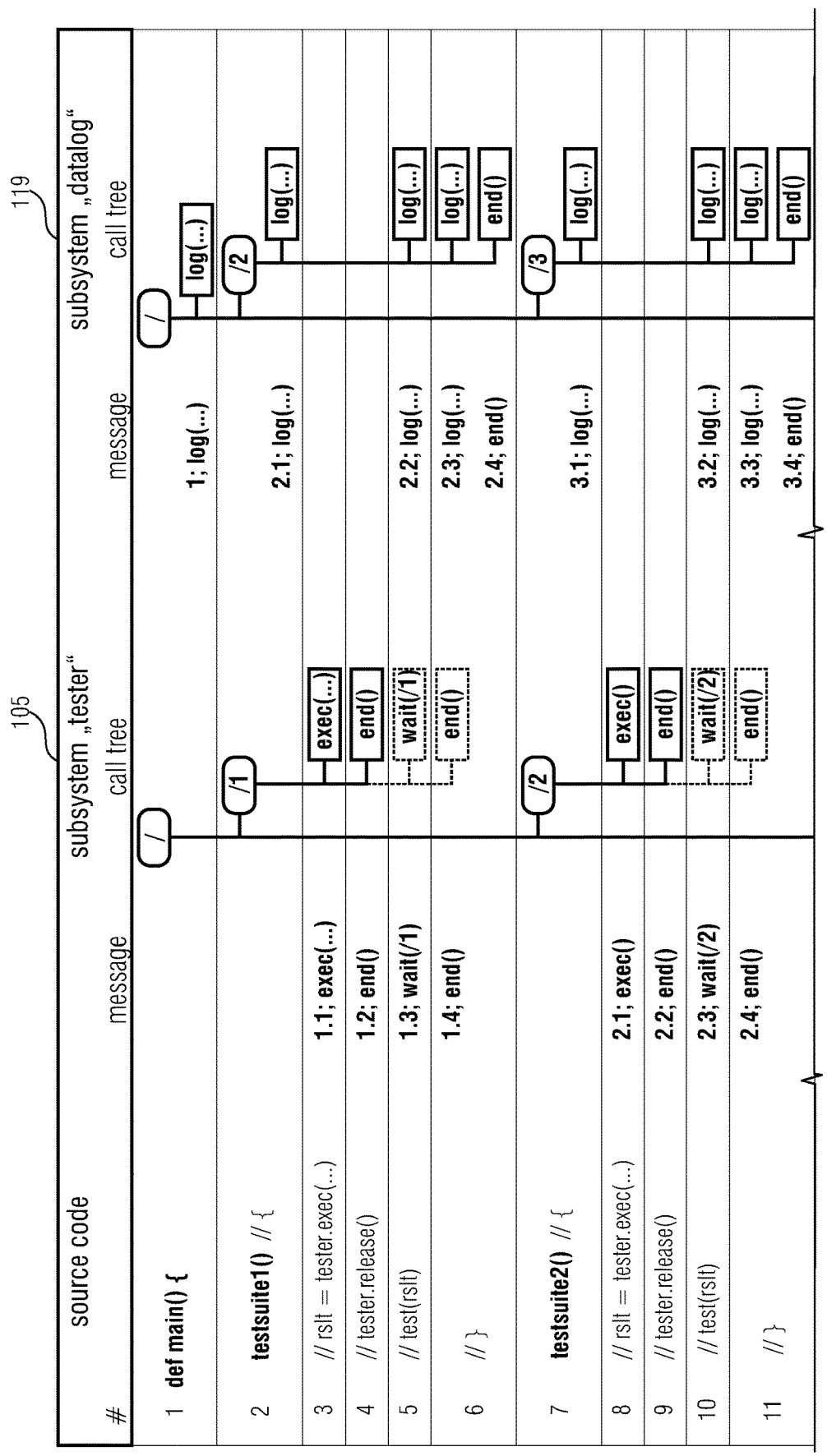
FIG. 15 shows a further implementation of an embodiment of an inventive test program executor including a datalog subsystem.
Figure 15:
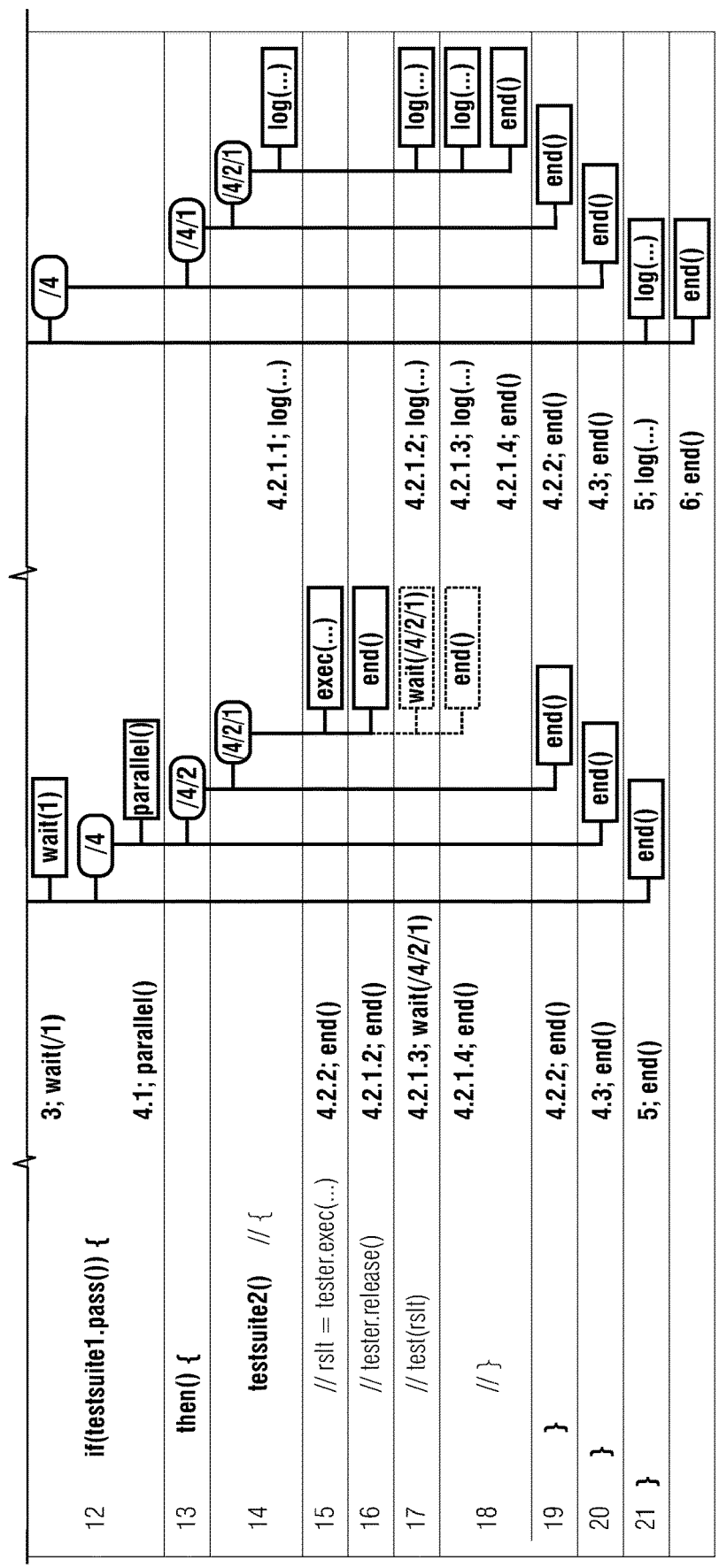

FIG. 15 shows an example flow. All test suites release the tester subsystem 105 right after issuing the execution command. Only then they test the execution result and return it to the flow level. Besides call graph information, data dependencies are transmitted to the test system. Blocks with potential for parallel executions are marked. This allows the test system executor 101 to combine multiple calls into a single more efficient call without blocking the flow execution. Combining multiple calls into a single more efficient call is also referred to herein as "bursting" or "burst execution". Also the executor 101 can run calls in parallel in the accordingly marked blocks. The parallel block in the example of FIG. 15 only contains a single branch though. So in this particular case, there is no potential for parallel execution.

Messages sent to the datalog subsystem 119 only include call graph information. Information on data dependencies are not needed as the datalog subsystem cannot block the flow execution anyway. Also information about parallel execution is not needed as the datalog needs to be written in a deterministic sequential order just based on the call tree hierarchy.

Deterministic Scheduling of Operations in a Modular Subsystem

The reconstructed call trees described in the previous chapter allow combining single operations to a larger program. In the present disclosure, this is also referred to as "bursting". Given a modular subsystem with real time execution capabilities, this allows a fully deterministic and repeatable execution of sequences of commands scheduled with non-deterministic timing but deterministic order. Executing the combined single operations within said single larger program is also referred to as "burst execution" or "burst executing".

The following sections first show how to map a linear sequence to per-module execution schedules, and then extend this to parallel execution of branches in a call tree. Finally it is shown, how modules shared between parallel branches are arbitrated.

Scheduling of Linear Sequences

Figure 16:
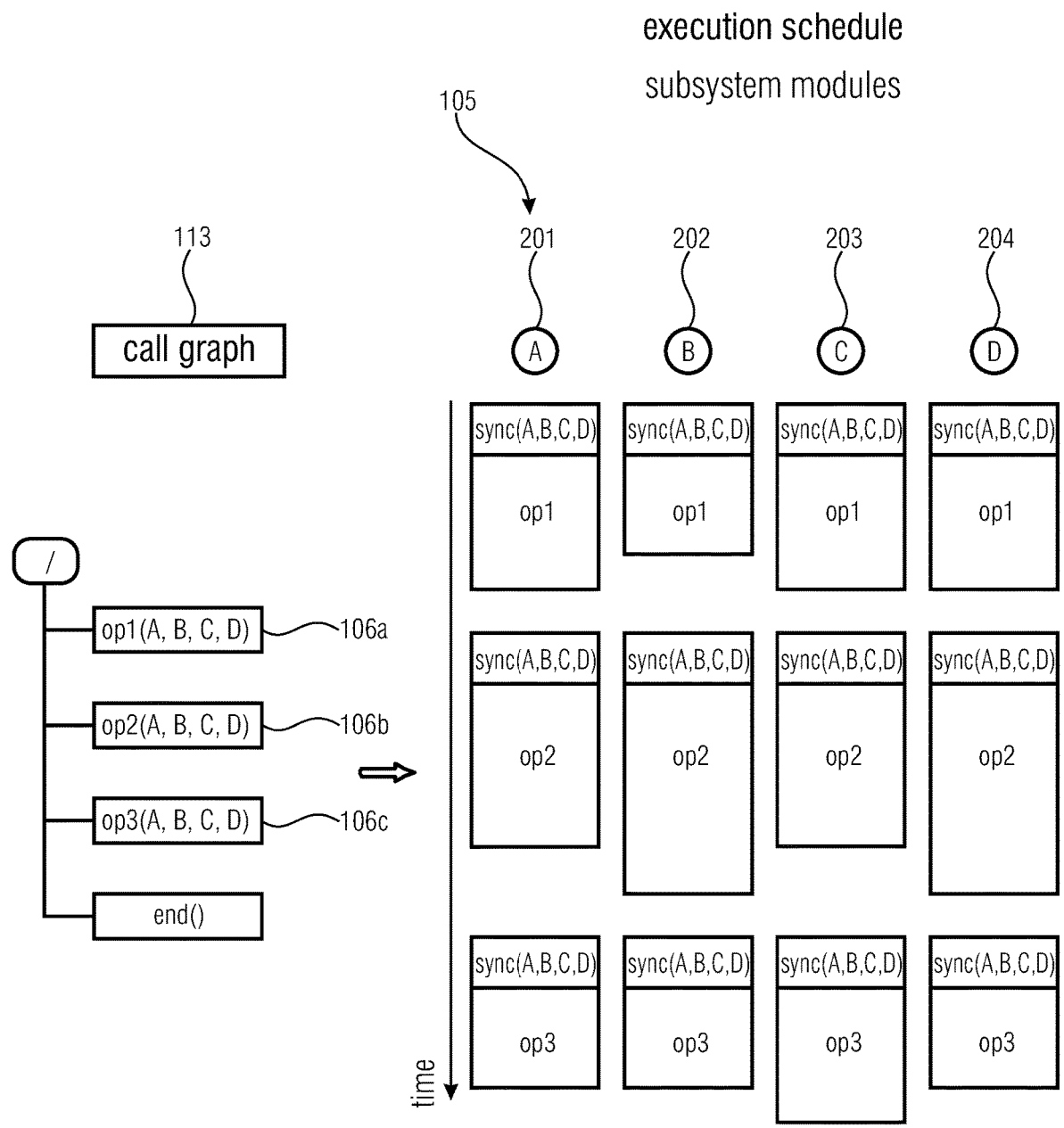
FIG. 16 shows a block diagram of a scheduling scheme.

As shown in FIG. 16, the system 105 is comprised of multiple independent modules A, B, C, D 201, 202, 203, 204, each capable of executing commands and synchronizing the command's start with all other modules.

A scheduler transforms the subsystem's call graph 113 into separate per module programs 106a, 106b, 106c. It steps through the graph 113 in linear order. For each operation 106a, 106b, 106c, it determines the involved modules A, B, C, D 201, 202, 203, 204. It adds a synchronization request and the command itself to each module's program. When the scheduler has fully processed the call graph 113, it runs the programs on all modules. In case all synchronization and execution times for all commands are deterministic, the whole subsystem execution is deterministic as well.

FIG. 16 shows an example execution. The subsystem 105 is comprised of the four modules A, B, C and D. The call graph 113 contains a linear sequence with three operations op1, op2 and op3, which all operate on the four available modules 201, 202, 203, 204. The per-module programs 106a, 106b, 106c are identical in this case. Before each operation each module is synchronized with all other modules.

Scheduling of Parallel Branches

Figure 17:
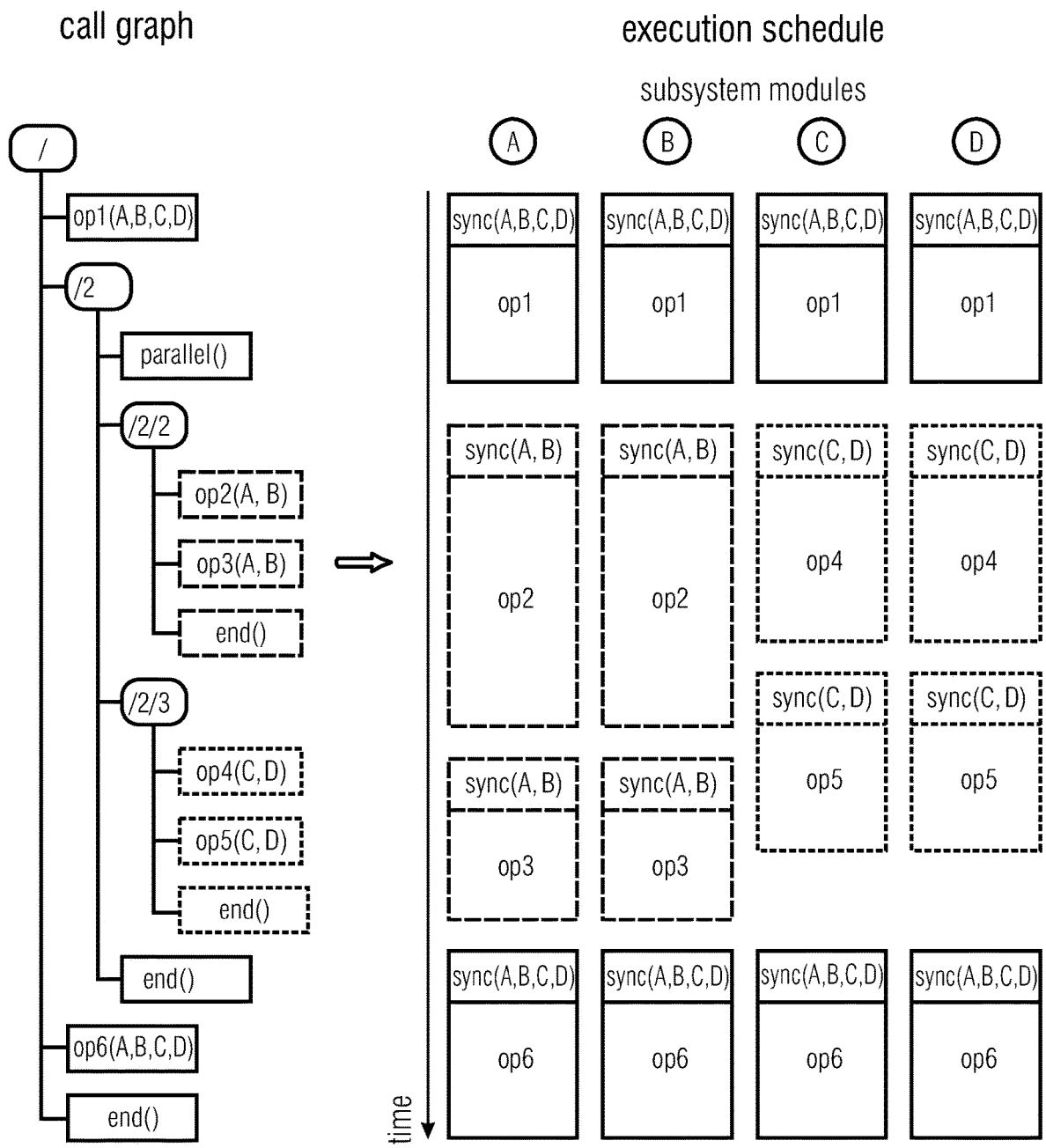
FIG. 17 shows a further block diagram of a scheduling scheme.

Referring to FIG. 17, when processing schedules containing parallel branches, the scheduler still processes each hierarchy level in linear order. All elements of a sub tree are processed before the next element on the same hierarchy level.

FIG. 17 shows an example. The scheduler processes the commands in the order op1 to op6. After operation op the execution is split into two parallel programs running on modules A, B and C, D respectively. The control flow merge before op6 in the call graph does not entail any special handling in the scheduler: it is implicitly handled by the synchronization request associated with op6.

Sharing Modules Between Parallel Branches

Resource sharing between parallel branches is already implicitly handled by the scheduling algorithm described so far, where operations are added one by one to the subsystem modules' programs.

Figure 18:
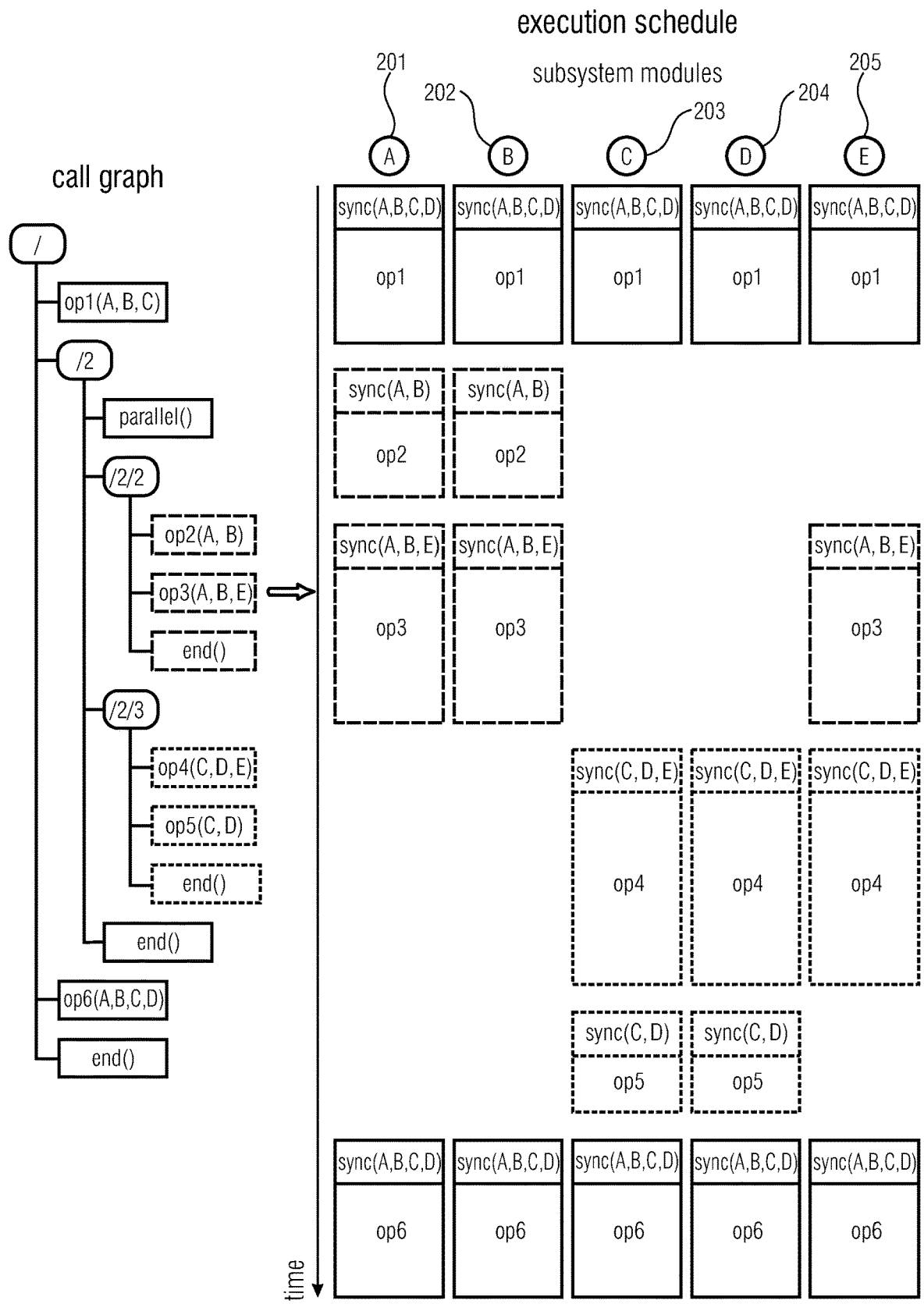
FIG. 18 shows a further block diagram of a scheduling scheme.

An example is shown in FIG. 18 where module E 205 is shared in two parallel branches by operations op3 and op4. The schedule created here is correct, but it may not be optimal: As the scheduler first dispatched all operations on the branch /2/2, all operations on the branch /2/3 are not executed in parallel anymore. This may in particular be a problem for long parallel sequences, where resources are switched forth and back between the branches.

Figure 19:
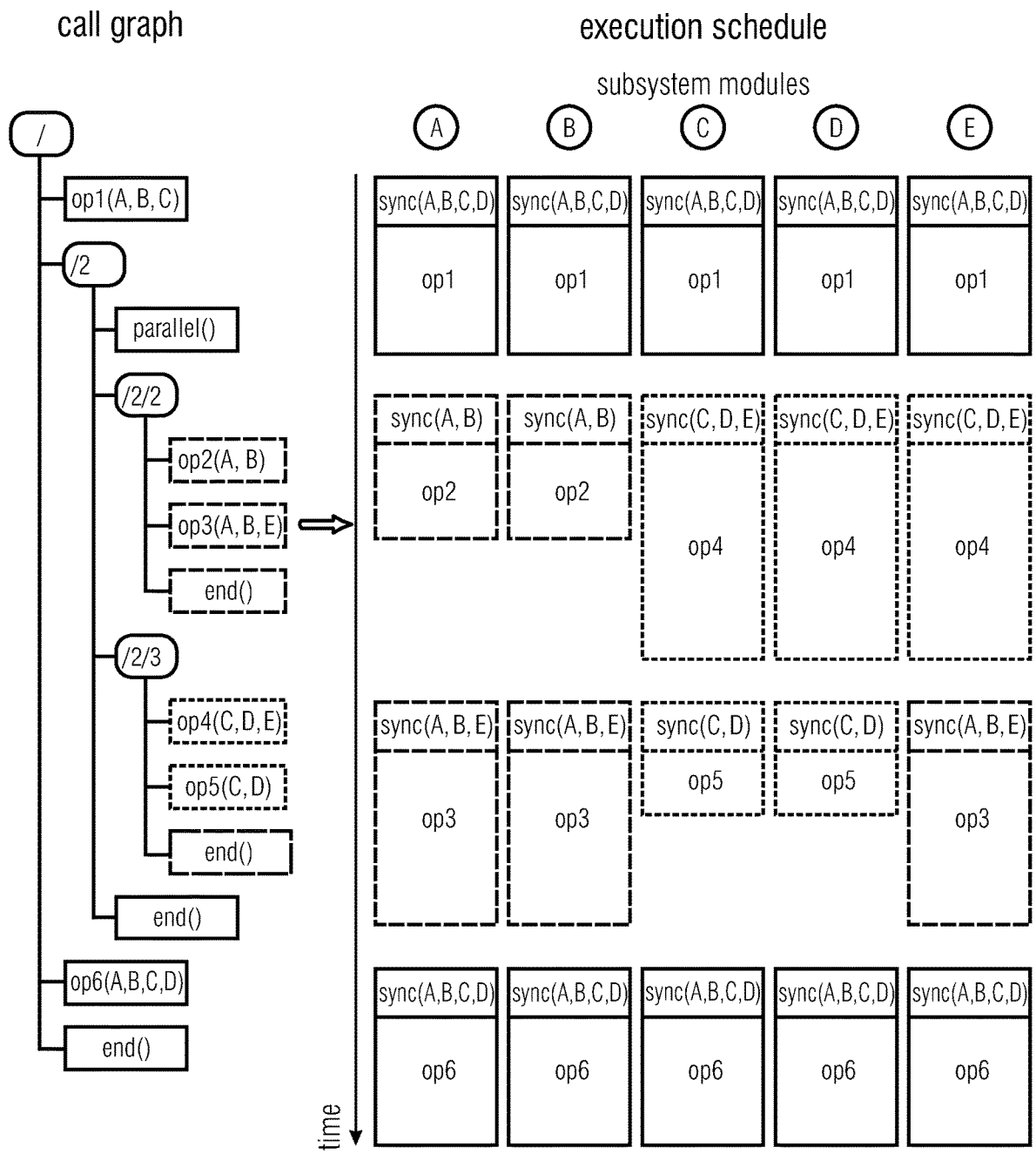
FIG. 19 shows a further block diagram of a scheduling scheme.

This can be fixed by a different scheduling strategy, where the scheduler steps through all branches in parallel, operation by operation. FIG. 19 shows the result when applying the improved scheduling strategy to the previous example.

Synchronizing Operations in a Modular Subsystem

The previous chapter showed how to construct per-module execution schedules. To be fully deterministic, these schedules must be synchronized. In the following sections, different synchronization strategies are discussed.

Startup Synchronization

The subsystem 105 provides support for a synchronous start of pre-compiled per-module sequencer programs. This is e.g. achieved by a single synchronization line connecting all modules. When the line signals a sequencer start, all modules start their sequencers simultaneously. This is a standard functionality of most ATE systems and widely available.

Hardware Based Re-Synchronization

Re-synchronizing running programs on different groups of modules at different points of time is more challenging than the startup synchronization. For the general case with independently running modules, this entails some form of synchronization bus, where each module informs all other modules whether it is waiting for synchronization. When a module entails synchronization with other modules, it first sets its flag. Then it checks the flags of the modules to be synchronized. When all flags are set, it resets its flag and resumes operation.

Software Based Re-Synchronization

As long as the execution time of all operations on all modules is known and deterministic, synchronization can be achieved with padding of module programs. When the scheduler builds the program, it inserts idle instructions to fill the gap in the execution schedule.

Mixed Synchronization

The different synchronization methods have different costs and constraints. Software based re-synchronization generates no execution time overhead, but adds extra preparation time for the module programs. Furthermore, it is only feasible for operations with known deterministic execution times. Hardware based resynchronization entails no extra preparation. The execution time of single operations can be variable. However, it adds delay due to real time information distribution between modules. Startup synchronization works, but adds the highest overhead.

With these parameters in most cases the best strategy should be to first attempt to use software synchronization and only use hardware synchronization as a fallback where the execution time of operations is not known.

Processing Results from a Modular Subsystem

The previous chapters described how to execute operations in a modular subsystem, ignoring operations returning results to the controlling system. The following sections show implementations for subsystem capable of fully asynchronous communication and a subsystem where modules have a local result storage which must be queried from the controlling system.

Asynchronous Communication

Figure 20:
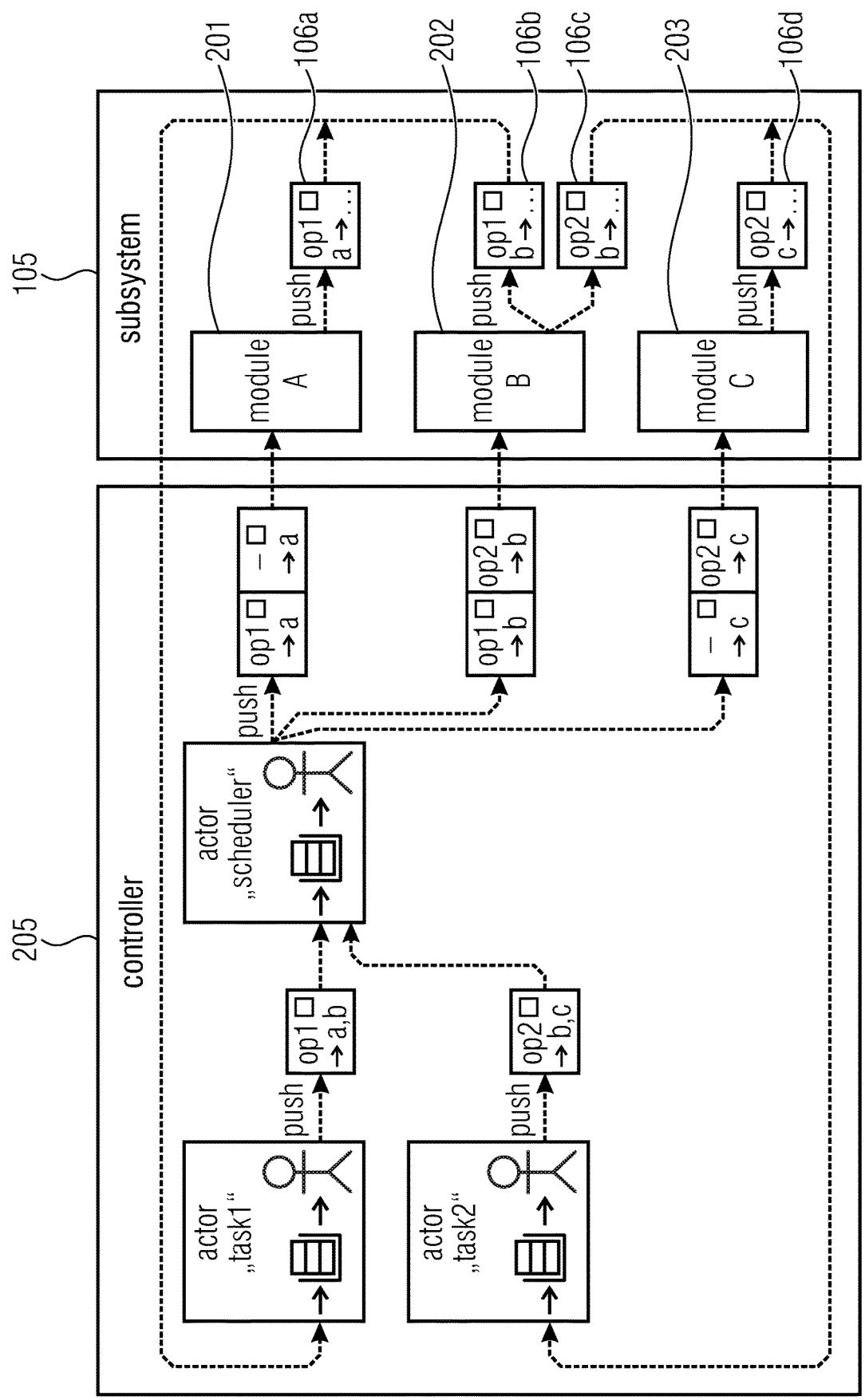
FIG. 20 shows a block diagram with actors executing an asynchronous result processing.

Referring to FIG. 20, in the asynchronous communication model, subsystem modules 201, 202, 203 return results immediately when an operation 106a to 106d is executed. On the side of the subsystem's controller 205, the responses are routed to the tasks, which are waiting for the results.

FIG. 20 shows a conceptual example where the software running on the controller 205 makes use of the actor model introduced in the above section called "Modeling Flow Decisions as Actors". Actor "task1" issues an operation "op1" to be executed on subsystem modules "A" and "B", "task2" issues an operation "op2" to be executed on "B" and "C". The actors do not send the operations directly to the subsystem 105 but to another actor "scheduler", which creates a real time sequences for the subsystem modules 201, 202, 203 and triggers the subsystem execution. While the execution is in progress, the subsystem modules 201, 202, 203 generate results while processing the single commands. They immediately push these results to the actors "task1" and "task2" inboxes. The actors finally process the results asynchronously.

Deferred Result Retrieval from Module Memory

Figure 21:
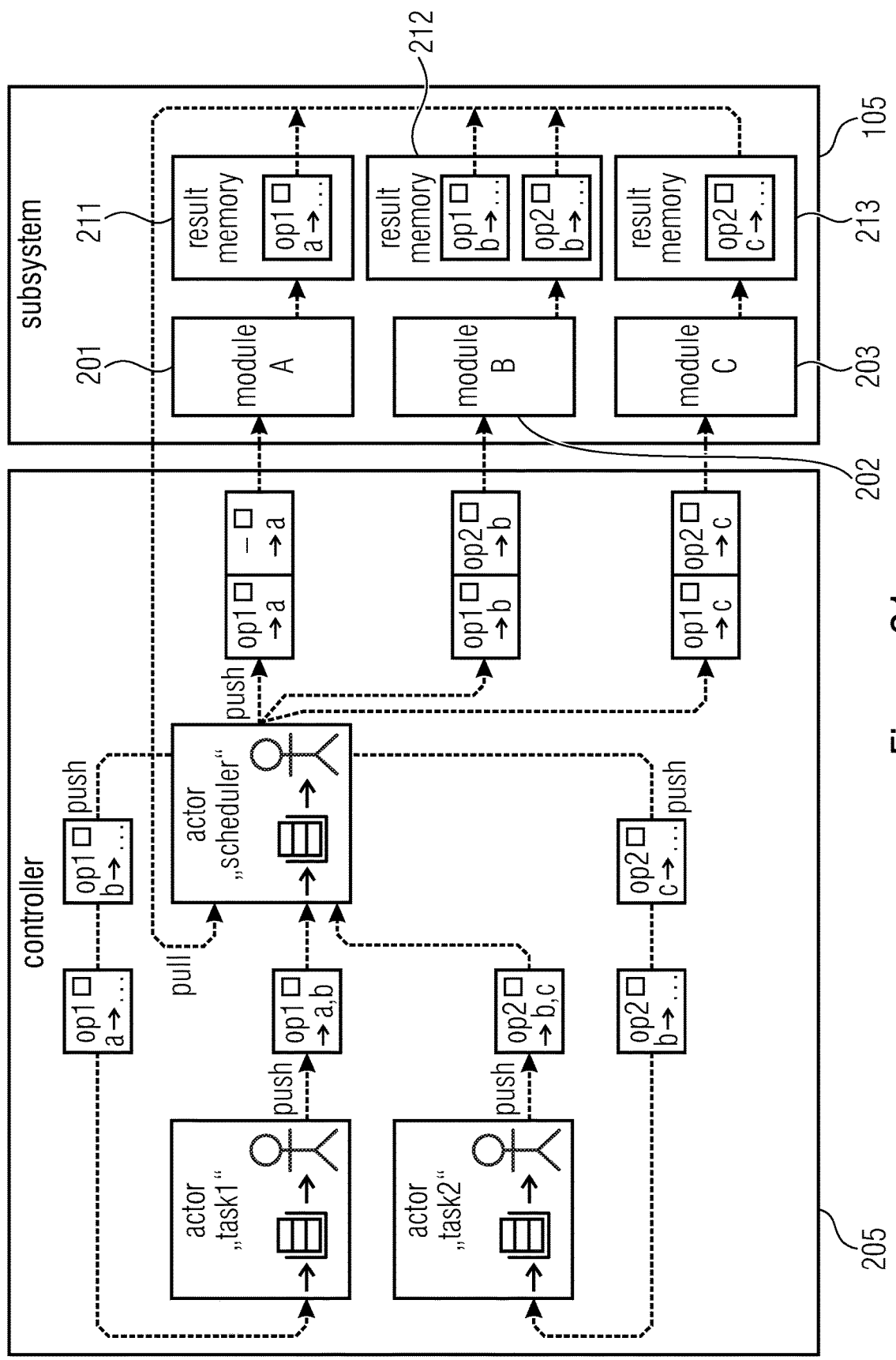
FIG. 21 shows a block diagram with actors executing a synchronous result processing.

Referring to FIG. 21, here subsystem modules 201, 202, 203 store the results of operations in a dedicated per module local result memory 211, 212, 213. After each execution is finished, the controller 205 synchronously pulls all available results from this memory 211, 212, 213 and processes them.

FIG. 21 shows an example. With respect to operation dispatching and execution, it is identical to the example from for the asynchronous communication. Results are processed differently. Whenever a module 201, 202, 203 executes an operation, it stores the result in its local result memory 211, 212, 213. The "scheduler" actor now waits for all operations to finish. Then it reads the results from the modules' result memory 211, 212, 213 and forwards them asynchronously to the actors "task1" and "task2".

Comparison to Existing Alternative Approaches

In this chapter we look at already existing approaches trying to solve the same challenges as the concept shown in this disclosure.

SmartCalc®

SmartCalc® is a software library for asynchronous result upload and processing available on the Advantest 93000®. Using its capabilities, users can write test methods, which spawn one thread per site for result processing. Inside this thread, they have access to a limited set of thread safe result retrieval and processing functions. For proper binning and logging the user must also write another test method and place it into the flow at a point where, the computations are completed.

The concept shown here does not limit multi-threading to result processing, as multi-threading is implicitly available on all levels. There is no need for a dedicated test suite for logging and binning as this also implicitly handled by the system.

Multiport Burst Labels

Multiport burst labels allow to manually construct a burst on a Advantest 93000® test system, where the per-pin sequencer are manually grouped into ports and per-port sequences of pattern are executed in a single sequencer run. Multiport burst labels are usually constructed by ATPG tools or the pattern editor shipped with the 93000®. They can be also programmatically constructed via 93000® firmware commands.

Concurrent Test Framework

The Concurrent Test Framework is a software framework to automate the construction and execution of multi-port burst labels on an Advantest 93000® test system. To use it, users must derive their test methods from a base class provided in the framework. The test method must be structured into three steps: test setup, test execution and test evaluation. The execution step is provided by the framework and is limited to a single sequencer run in hardware.

Test suites for the concurrent test framework must be added to the flow in a linear sequence followed by a dedicated test suite provided in the framework. This test suite analyses the port utilization of the sequencer runs from the previous test suite and combines them into a single multi-port burst sequence. Depending on a flag in the flow now either each test suite triggers the execution or the framework test method triggers a burst execution.

Other than in the concurrent test framework, burst creation in the concept shown in this disclosure is opportunistically and therefore more flexible. The underlying execution engine checks whether tests can be bursted in the current context or not and creates as many bursts as applicable. There are no special coding requirements as in the concurrent test framework. And it also extends to other situation e.g. the current result configuration of instrument. With the concurrent test framework users must manually track this. Otherwise results might be not accessible in a bursted execution.

With the concurrent test framework, parallelism is somewhat hidden in the port information of the test suite's sequencer programs/patter. In the concept shown in this disclosure, parallelism is explicitly stated on the test flow level.

Independent Sequencer Runs

Recent versions of the Advantest 93000® test system allow independently starting and stopping per-pin sequencers. This allows for fully asynchronous concurrent test, where tests are scheduled from multiple independently running workstation threads. The advantages of this approach are its simplicity and the optimal use of resources, which get freed up by previous tests.

But there are also disadvantages. Test scheduling is non-deterministic and not repeatable, which leads to an increased debug effort for users. Shared tester resources must be arbitrated on the fly. In case of high tester resource contention this either leads to excessive blocking of tests, or the tests must be split up in multiple parts, which makes the tests more sensitive to sequencer start overhead. Last but not least, the multi-threaded processing can lead to high contention of the serial link connecting the workstation and the test system. This also causes additional overhead.

The concept shown in this disclosure has totally different properties. It cannot utilize freed up tester resources as efficiently as the approach with independent sequencer run. On the test scheduling is fully deterministic. Tester resource arbitration can be pre-computed when building the bursts without generating additional execution time overhead. There is no contention on the serial link as there is only one sequencer run at a time.

Independent Sequencer Runs in the Concurrent Test Framework

Recently, the Concurrent Test Framework also has been extended to make use of independent sequencer runs. To use it, test suites are marked to be executed in asynchronously. The Concurrent Test Framework executor spans a separate thread it uses to execute the marked test suites. This thread is fully independent of the main thread of execution: it is never synchronized with the main thread and cannot influence its control flow.

While this approach is limited especially compared to a fully multi-threaded execution, it addresses one application nicely: background execution of long running scan pattern in parallel to short parametric tests.

The concept shown in this disclosure could potentially be extended into this direction. It is suggested that this could, for instance, be achieved by a special flag on the parallel statement and some addition to either allocate the resources for the branches upfront or arbitrate them between the threads dynamically.

CONCLUSION

Bursting tests to improve to avoid communication overheads and to implement concurrent tests is an existing proven technique on ATE systems. The way shown here how these bursts are computed from the user's test program is radically different from any existing approach in the ATE industry.

The top level program still appears as a sequential test flow with a few extensions for concurrent tests and automated flow reordering. Under the hood, this flow is mapped to an actor system, which is a new approach for ATE systems. In this system, each sub flow, test suite, and control flow branch is executed by a dedicated actor. Especially as ATE test flows usually only have a low amount of data flow dependencies, this allows for massive parallel execution and in turn for good utilization even of larger numbers of CPUs.

To reestablish order, a new approach is chosen by including call tree information in the messages send to the actors responsible for test execution and datalog generation. These actors use it to organize operations in a call tree identical to the original high level programs call tree. While the datalog generation actor just interprets the tree and dumps datalog messages in the right order, the test execution actor combines operations into longer bursts and executes them. This allows for repeatable, deterministic concurrent test execution with a minimal overhead for tester hardware preparation and tester communication in a way similar to the existing concurrent test framework.

Overall, this allows addressing most of the throughput challenges. Yet, the external use model visible to users is still very close to existing systems. Also, the system requirements are limited, as the tester low level hardware control can be wrapped into the test execution system, the approach can be implemented on top of existing ATE systems without major changes to the basic architecture.

These benefits differentiate the concept shown here from all its predecessors and make it unique.

All in all, this disclosure shows a concept addressing all of the above challenges. The result is a system, where the test flow execution scales to massive parallel systems, while providing deterministic execution of concurrent tests on the DUT, the proper management of shared resources, as well as the generation of a deterministically ordered datalog.

From an application perspective, the approach is at the same time very close to the traditional ATE use model. Current users can therefore benefit very quickly from the benefits of the inventive concept. From a hardware perspective, most current ATE systems fulfill the requirements of the concept shown here. Existing systems can be easily adapted to the new approach, even the low level tester control software does not need to be changed.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus comprising:
a test program executor for an automated test equipment, wherein the test program executor is configured to execute a test flow comprising a plurality of test suites,
wherein the test program executor is configured
to asynchronously execute the plurality of test suites, wherein a test suite of the test suites comprises a call of a subsystem function of a subsystem, wherein the subsystem function of the subsystem is related to a subsystem operation that is to be executed by the subsystem, and
to signal the call of the subsystem function of the subsystem by transmitting an asynchronous request to the subsystem, the asynchronous request comprising a call tree hierarchy address that is call specific and the subsystem operation that is call specific to be executed by the subsystem, and wherein the test program executor is further configured to
determine an execution order of a plurality of subsystem operations, wherein the order of the execution sequence of the subsystem operations is based on the order of respective call tree hierarchy addresses that are specific and are associated with the subsystem operations.

2. The apparatus of claim 1, wherein the subsystem is configured to receive the plurality of asynchronous requests and to build a call tree comprising the subsystem operations that have been transmitted with the asynchronous requests, wherein a position of each of the subsystem operations transmitted with the asynchronous requests within the call tree is organized based on the respective call tree hierarchy addresses transmitted with the asynchronous requests.

3. The apparatus of claim 2, wherein the subsystem is configured to extend a call tree hierarchy level of the call tree by an additional level when an additional test suite is called.

4. The apparatus of claim 2, wherein the test program executor is configured to associate, when a respective subsystem function is called within a respective test suite, an individual call tree hierarchy address with a respective call.

5. The apparatus of claim 2, wherein the test program executor is configured to associate, at each call tree hierarchy level, each subsystem operation with an individual call tree hierarchy address, wherein each of the individual call tree hierarchy addresses comprises an information as to respective call tree hierarchy level and an order of execution of respective subsystem operation within the respective call tree hierarchy level.

6. The apparatus of claim 1, wherein the test program executor is configured to signal the subsystem, when the test suite is finished, that no additional calls of subsystem functions will be issued.

7. The apparatus of claim 1, wherein the test program executor is configured to signal the subsystem, when a respective subsystem operation at a certain call tree hierarchy level is finished, that no additional calls of subsystem functions will be issued at the certain call tree hierarchy level.

8. The apparatus of claim 6, wherein the test program executor is configured to transmit to the subsystem an asynchronous end-request at an end of the test suite and/or at an end of the subsystem function, wherein the asynchronous end-request comprises an individual call tree hierarchy address and an end-operation that signals the subsystem that no additional calls will be issued.

9. The apparatus of claim 8, wherein the subsystem is configured to receive the asynchronous end-request and to insert the end-operation transmitted with the asynchronous end-request into a call tree at a call tree position that depends on the individual call tree hierarchy address associated with the end-operation transmitted with the asynchronous end-request and wherein the subsystem is configured to build the call tree.

10. The apparatus of claim 1, wherein, if an execution of a second test suite depends on a result of an execution of a first test suite, the test program executor is configured to transmit an asynchronous wait-request to the subsystem, wherein the asynchronous wait-request comprises an individual call tree hierarchy address and a wait-operation that signals the subsystem to wait with respect to the execution of the second test suite until the execution of the first test suite returns the result.

11. The apparatus of claim 10, wherein the subsystem is configured to receive the asynchronous wait-request and to insert the wait-operation into a call tree at a call tree position that depends on the individual call tree hierarchy address associated with the wait-operation transmitted with the asynchronous wait-request, and wherein the subsystem is configured to build the call tree.

12. The apparatus of claim 1, wherein the subsystem is configured to traverse at least one of a plurality of branches of a call tree to collect the subsystem operations until the subsystem reaches an end-operation, a wait-operation, or an end of the call tree in a respective one of the branches, and wherein the subsystem is configured to build the call tree.

13. The apparatus of claim 12, wherein, when the subsystem reaches the end of the respective one of the branches in the call tree, the subsystem is configured to check for the end-operation and to continue an execution of the subsystem operations at a parent level if there is the end-operation, or to wait for an additional call on a current call tree hierarchy level if there is not the end-operation or wait-operation.

14. The apparatus of claim 12, wherein the subsystem is configured subsequently to execute the subsystem operations that have been collected by traversing the branches of the call tree.

15. The apparatus of claim 14, wherein the subsystem is configured to execute the subsystem operations collected by traversing the branches of the call tree in an order defined by individual call tree hierarchy addresses associated with the subsystem operations.

16. The apparatus of claim 12, wherein the test program executor is configured to configure a tester hardware that is capable to output a real time testing sequence for a device under test to burst-execute the subsystem operations collected by traversing the branches of the call tree.

17. The apparatus of claim 1, wherein the subsystem is configured to optimize a plurality of the subsystem function by combining at least two of the plurality of calls of the subsystem function into a common combined call of the subsystem function, or by reordering the at least two of the plurality of calls of the subsystem function.

18. The apparatus of claim 1, wherein the test program executor is configured to transmit, when at least two of the test suites are executable in parallel, an asynchronous parallel-execution-request to the subsystem, the asynchronous parallel-execution-request comprising an individual call tree hierarchy address and a parallel-execution-operation which signals the subsystem that the at least two of the two test suites are executable in parallel.

19. The apparatus of claim 18, wherein the subsystem is configured to extend a call tree hierarchy level by an additional level when the subsystem receives the asynchronous parallel-execution-request, and wherein the subsystem is configured to build the call tree.

20. The apparatus of claim 1, wherein the test program executor is configured to transmit, when a least two subsystem functions within the test suite are callable in an unordered manner, an asynchronous unordered-execution-request to the subsystem, the asynchronous unordered-execution-request comprising an individual call tree hierarchy address and an unordered-execution-operation which signals the subsystem that related at least two subsystem operations of the test suite are executable in an unordered manner that does not depend on respective individual call tree hierarchy address associated with at least two subsystem operations.

21. The apparatus of claim 20, wherein the subsystem is configured to extend a call tree hierarchy level of a call tree by an additional level when the subsystem receives the asynchronous unordered-execution-request, and wherein the subsystem is configured to build the call tree.

22. The apparatus of claim 1 further comprising a scheduler that is configured to generate a test program that is executable on tester hardware in a manner in which the subsystem operations of the test program are deterministically executed in the order defined by the call tree, and wherein the subsystem is configured to build the call tree.

23. The apparatus of claim 1 further comprising a datalog subsystem that is configured to write a call hierarchy of the test flow and the plurality of test suites to a datalog comprising a log entry at a start of the test flow and/or a start of the test suite and another log entry at an end of the test flow and/or an end of the test suite.

24. A non-transitory digital storage medium comprising stored thereon a computer program for implementing a test program executor for an automated test equipment, wherein the test program executor is configured to execute a test flow comprising a plurality of test suites,
wherein the test program executor is configured:
to asynchronously execute the plurality of test suites, wherein a test suite of the test suites comprises a call of a subsystem function of a subsystem,
wherein the subsystem function of the subsystem is related to a subsystem operation that is to be executed by the subsystem, and
to signal the call of the subsystem function of the subsystem by transmitting an asynchronous request to the subsystem, the asynchronous request comprising a call tree hierarchy address that is call specific and the subsystem operation that is call specific to be executed by the subsystem, and wherein the test program executor is further configured to
determine an execution order of a plurality of subsystem operations, wherein the order of the execution sequence of the subsystem operations based on the order of respective call tree hierarchy addresses that are specific and are associated with the subsystem operations.

25. The apparatus of claim 1 further comprising a test apparatus operable to test a device under test and comprising automated test equipment.

26. The apparatus of claim 25 wherein the test apparatus further comprises a computer hardware that is configured to control the test program executor, and a tester hardware operable to control the device under test.

27. The apparatus of claim 26, wherein the computer hardware is configured to execute the test program executor in a multiprocessing manner or a multithreading manner, and wherein the tester hardware comprises real-time deterministic tester hardware.

* * * * *